US009892703B2

(12) United States Patent
Tsuchi

(10) Patent No.: US 9,892,703 B2
(45) Date of Patent: *Feb. 13, 2018

(54) OUTPUT CIRCUIT, DATA DRIVER, AND DISPLAY DEVICE

(71) Applicant: Renesas Electronics Corporation, Kawasaki-shi (JP)

(72) Inventor: Hiroshi Tsuchi, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 164 days.

This patent is subject to a terminal disclaimer.

(21) Appl. No.: 14/664,076

(22) Filed: Mar. 20, 2015

(65) Prior Publication Data

US 2015/0194115 A1    Jul. 9, 2015

Related U.S. Application Data

(63) Continuation of application No. 13/317,858, filed on Oct. 31, 2011, now Pat. No. 8,988,402.

(30) Foreign Application Priority Data

Nov. 24, 2010 (JP) .................... 2010-261082

(51) Int. Cl.
  *G09G 3/36* (2006.01)
  *H03F 1/02* (2006.01)
  (Continued)

(52) U.S. Cl.
  CPC ......... *G09G 3/3677* (2013.01); *G09G 3/3258* (2013.01); *G09G 3/3291* (2013.01);
  (Continued)

(58) Field of Classification Search
  CPC .. G09G 3/3677; G09G 3/3688; G09G 3/3291; G09G 2300/0426;
  (Continued)

(56) References Cited

U.S. PATENT DOCUMENTS 5,144,392 A * 9/1992 Brotherton ........ H01L 29/78696
                                                                257/350
5,539,457 A    7/1996 Tsunai
(Continued)

FOREIGN PATENT DOCUMENTS

JP    2007-208316 A    8/2007
JP    2007-259114 A    10/2007
(Continued)

OTHER PUBLICATIONS

United States Office Action dated Aug. 14, 2013.
(Continued)

*Primary Examiner* — Lun-Yi Lao
*Assistant Examiner* — Johny Lau
(74) *Attorney, Agent, or Firm* — McGinn IP Law Group, PLLC

(57) ABSTRACT

A display device includes an output circuit including a differential amplifier circuit, an output amplifier circuit that includes a first transistor of the first conduction type coupled between the first supply terminal and the output terminal, and including a control terminal coupled to the differential amplifier circuit, a first control circuit, an input terminal, an output terminal, and first to third supply terminals to which first to third supply voltages are applied, wherein the third supply voltage is set to a voltage between the first supply voltage and the second supply voltage, or the second supply voltage, and wherein the first control circuit includes a third (Continued)

transistor and a first switch which are coupled in series between the first supply terminal and the control terminal of the first transistor.

18 Claims, 21 Drawing Sheets

(51) Int. Cl.
  *H03F 3/45* (2006.01)
  *G09G 3/3258* (2016.01)
  *G09G 3/3291* (2016.01)

(52) U.S. Cl.
  CPC ......... *G09G 3/3688* (2013.01); *H03F 1/0261* (2013.01); *H03F 3/4526* (2013.01); *H03F 3/45179* (2013.01); *G09G 2300/0426* (2013.01); *G09G 2310/0289* (2013.01); *G09G 2310/0291* (2013.01); *G09G 2330/021* (2013.01); *H03F 2200/18* (2013.01); *H03F 2200/27* (2013.01); *H03F 2203/45562* (2013.01); *H03F 2203/45614* (2013.01); *H03F 2203/45618* (2013.01); *H03F 2203/45644* (2013.01); *H03F 2203/45674* (2013.01); *H03F 2203/45676* (2013.01); *H03F 2203/45724* (2013.01); *H03F 2203/45728* (2013.01)

(58) Field of Classification Search
  CPC ... G09G 2310/0289; G09G 2310/0291; G09G 2330/021; G09G 3/3258; H03F 1/0261; H03F 3/26; H03F 3/45179; H03F 3/4526; H03F 2200/18; H03F 2200/27; H03F 2203/45562; H03F 2203/45614; H03F 2203/45618; H03F 2203/45644; H03F 2203/45674; H03F 2203/45676; H03F 2203/45724; H03F 2203/45728; H03F 3/45; G06F 3/038; G11C 7/00
  See application file for complete search history.

(56) References Cited

U.S. PATENT DOCUMENTS

| | | | |
|---|---|---|---|
| 6,624,683 B1* | 9/2003 | Bedarida | H03K 17/063 327/374 |
| 6,903,610 B2* | 6/2005 | Aoki | H03F 3/303 330/255 |
| 7,443,234 B2 | 10/2008 | Iriguchi | |
| 7,495,512 B2 | 2/2009 | Tsuchi | |
| 7,605,656 B2 | 10/2009 | Sung | |
| 7,683,600 B2 | 3/2010 | Kanamaru et al. | |
| 7,990,181 B1 | 8/2011 | Weigl | |
| 8,044,950 B2 | 10/2011 | Satou | |
| 8,217,925 B2 | 7/2012 | Nishimura | |
| 8,988,402 B2* | 3/2015 | Tsuchi | H03F 1/0261 330/253 |
| 2003/0174009 A1* | 9/2003 | Kimura | H03K 19/00384 327/427 |
| 2006/0113979 A1 | 6/2006 | Ishigaki et al. | |
| 2007/0159248 A1* | 7/2007 | Tsuchi | H03F 3/3022 330/253 |
| 2009/0231319 A1 | 9/2009 | Tsuchi | |
| 2009/0303210 A1 | 12/2009 | Nishimura | |
| 2011/0157150 A1* | 6/2011 | Wu | H03F 3/45475 345/214 |

FOREIGN PATENT DOCUMENTS

| | | |
|---|---|---|
| JP | 2008-271224 A | 11/2008 |
| JP | 2009-244830 A | 10/2009 |

OTHER PUBLICATIONS

United States Office Action dated Jan. 29, 2014.
United States Notice of Allowance dated Nov. 20, 2014.
Japanese Office Action dated Feb. 4, 2014 with an English Translation thereof.

* cited by examiner

100A

100B

100E

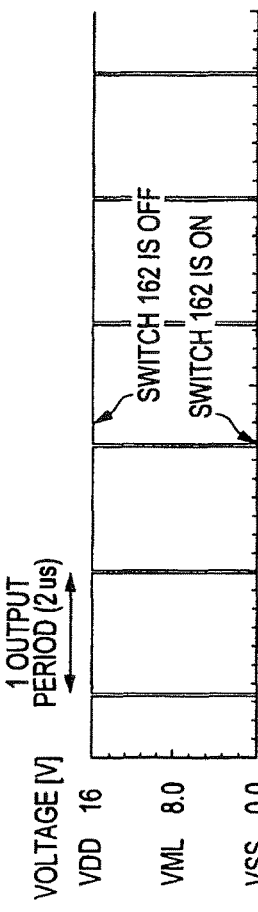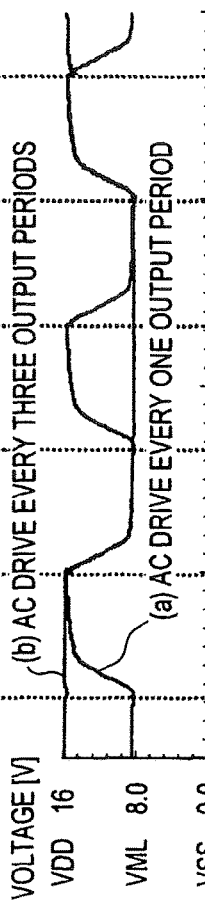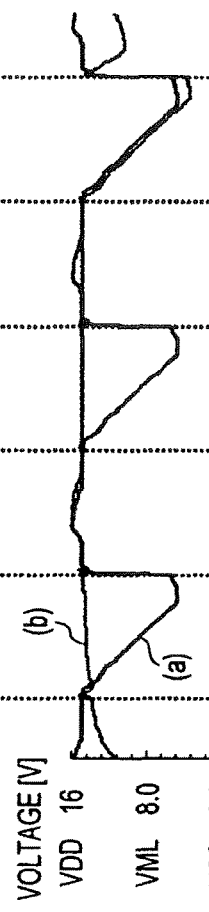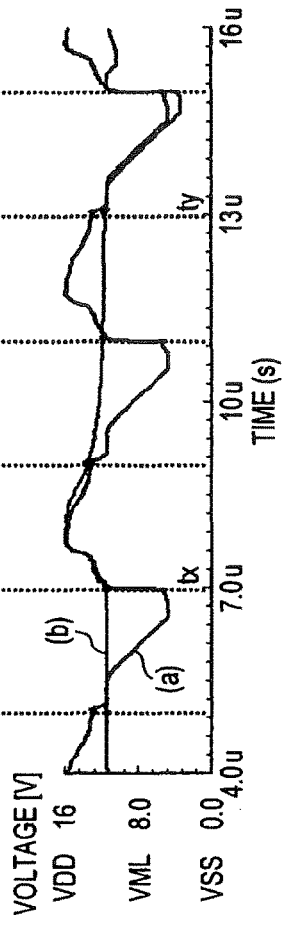
FIG. 10A CONTROL SIGNAL OF SWITCH 162 IN FIG. 1
FIG. 10B VOLTAGE WAVEFORM OF OUTPUT VO OF OUTPUT CIRCUIT IN FIG. 1
FIG. 10C GATE VOLTAGE WAVEFORM OF PMOS TRANSISTOR 121 IN FIG. 1
FIG. 10D GATE VOLTAGE WAVEFORM OF NMOS TRANSISTOR 122 IN FIG. 1

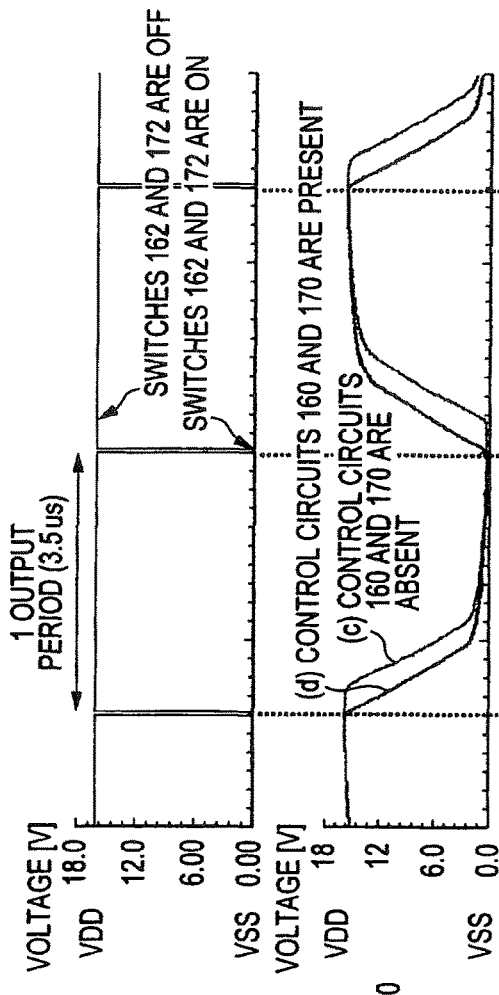
FIG. 11A CONTROL SIGNAL OF SWITCHES 162 AND 172 IN FIG. 4
FIG. 11B VOLTAGE WAVEFORM OF OUTPUT VO WHEN CONTROL CIRCUITS 160 AND 170 OF FIG. 4 ARE PRESENT AND ABSENT
FIG. 11C GATE VOLTAGE WAVEFORM OF PMOS TRANSISTOR 121 WHEN CONTROL CIRCUITS 160 AND 170 OF FIG. 4 ARE PRESENT/ABSENT
FIG. 11D GATE VOLTAGE WAVEFORM OF NMOS TRANSISTOR 122 WHEN CONTROL CIRCUITS 160 AND 170 OF FIG. 4 ARE PRESENT/ABSENT

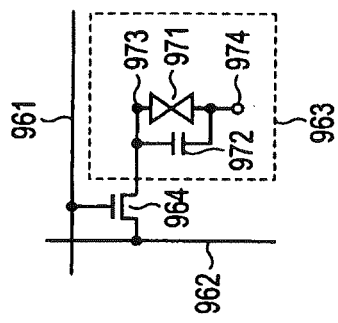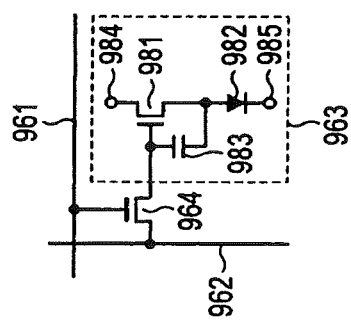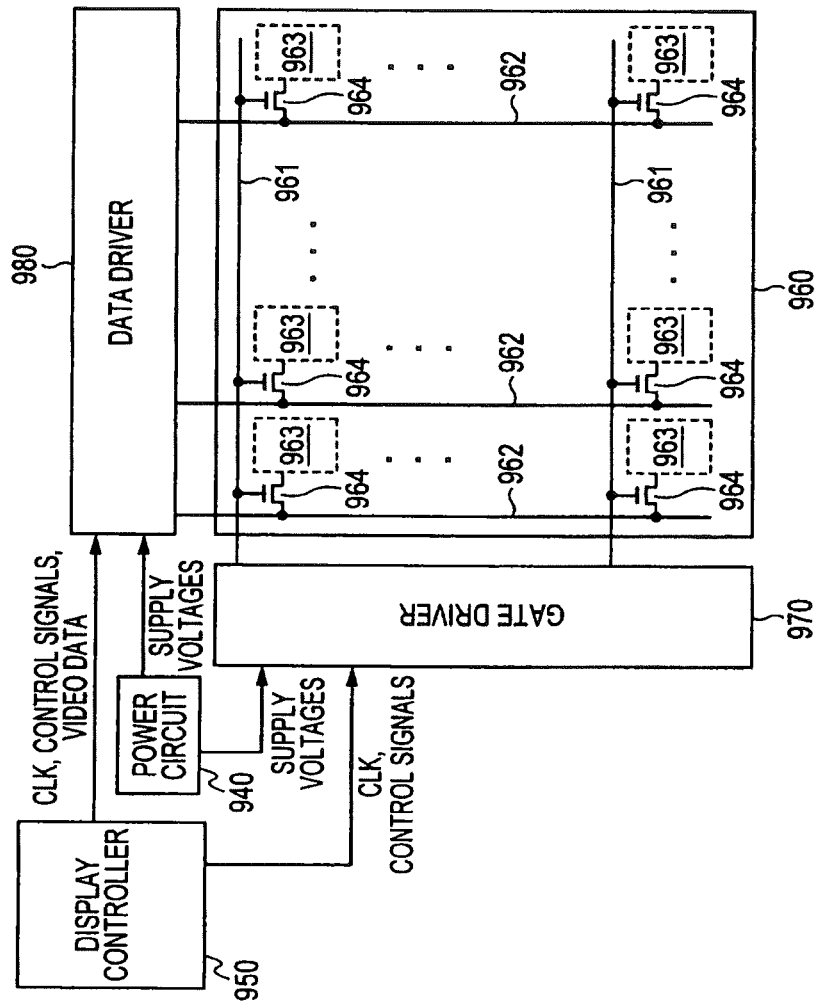

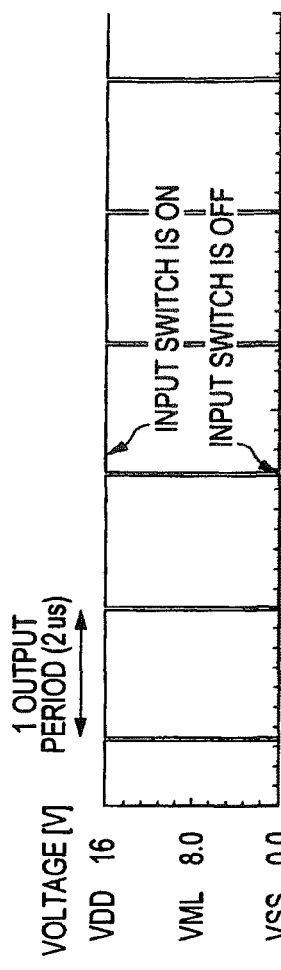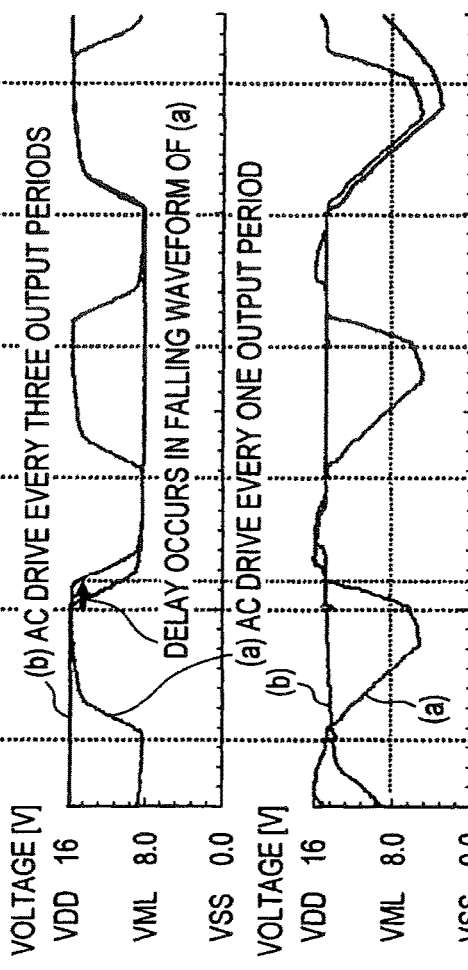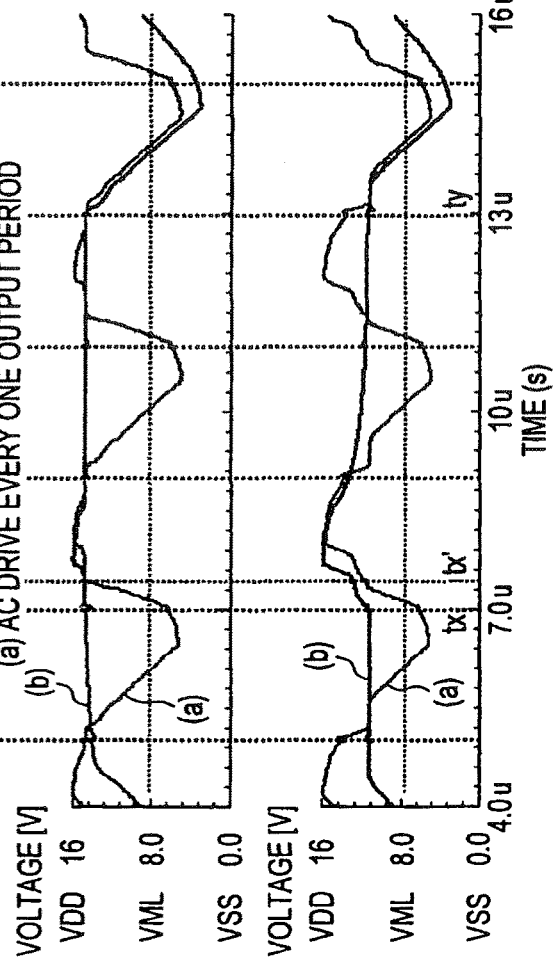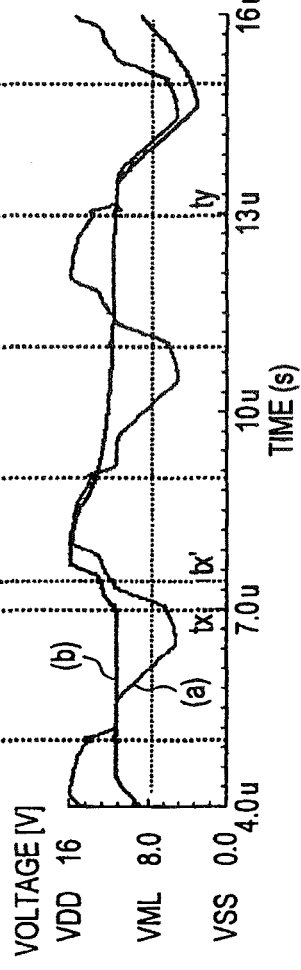
FIG. 21A INPUT SWITCH SW41 IN FIG. 18
FIG. 21B VOLTAGE WAVEFORM OF OUTPUT Vout1 OF POSITIVE DEDICATED OUTPUT STAGE 13 IN FIG. 19
FIG. 21C GATE VOLTAGE WAVEFORM OF MP18 OF POSITIVE DEDICATED OUTPUT STAGE 13 IN FIG. 19
FIG. 21D GATE VOLTAGE WAVEFORM OF MN18 OF POSITIVE DEDICATED OUTPUT STAGE 13 IN FIG. 19

OUTPUT CIRCUIT, DATA DRIVER, AND DISPLAY DEVICE

CROSS-REFERENCE TO RELATED APPLICATIONS

The present application is a Continuation application of U.S. patent application Ser. No. 13/317,858, filed on Oct. 31, 2011, which is based on Japanese Patent Application No. 2010-261082 filed on Nov. 24, 2010, the entire contents of which are hereby incorporated by reference.

BACKGROUND

The present invention relates to an output circuit, and a data driver for a display device using the output circuit.

In recent years, as display devices, liquid crystal display devices (LCDs) that is thin, light in weight, and low in power consumption have been widespread, and frequently used for display units of mobile devices such as cell phones (mobile phones, cellular phones), PDAs (personal digital assists), handheld terminals, or notebook computers. However, in recent years, technology for increasing the screen size and complying with moving images of the liquid crystal display device have been also improved, and can realize not only the mobile application but also large-screen display devices and large-screen liquid crystal televisions of a stationary type. As those liquid crystal display devices, liquid crystal display devices of an active matrix drive system which can conduct microdisplay are used.

Referring to FIGS. 17A to 17C, a description will be generally given of a typical configuration of a thin display device (liquid crystal display device and organic light emitting diode display device) of the active matrix drive system. FIG. 17A is a block diagram illustrating a main configuration of the thin display device, FIG. 17B illustrates a main configuration of a unit pixel of a display panel in the liquid crystal display device, and FIG. 17C illustrates a main configuration of a unit pixel of a display panel in the organic light emitting display device. The unit pixels of FIGS. 17B and 17C are schematically illustrated by equivalent circuits.

Referring to FIG. 17A, the thin display device of the active matrix drive system includes a power circuit 940, a display controller 950, a display panel 960, a gate driver 970, and a data driver 980. In the display panel 960, unit pixels each having a pixel switch 964 and a display element 963 are arranged in a matrix (for example, in a color SXGA (super extended graphics array) panel, 1280×3 pixel columns×1024 pixel rows), scanning lines 961 that transmit a scanning signal output from the gate driver 970 to the respective unit pixels, and data lines 962 that transmit a gradation voltage signal output from the data driver 980 to the respective unit pixels are wired in a lattice. The gate driver 970 and the data driver 980 are controlled by the display controller 950. Necessary clock CLK and control signals are supplied from the display controller 950 to the gate driver 970 and the data driver 980, and video data is supplied to the data driver 980 as a digital signal. The power circuit 940 supplies a necessary power to the gate driver 970 and the data driver 980. The display panel 960 is configured by a semiconductor substrate, and particularly in the large-screen display devices, semiconductor substrates in which pixel switches are formed of thin film transistors (TFTs) on an insulating substrate such as a glass substrate or a plastic substrate have been widely used.

The above display device controls on/off operation of the pixel switch 964 according to the scanning signal, and supplies the gradation voltage signal corresponding to the video data to each display element 963 when the pixel switch 964 turns on to change the luminance of the display element 963 according to the gradation voltage signal, thus displaying an image.

Data for one screen is rewritten in one frame period (normally about 0.017 seconds during driving at 60 Hz), each of the scanning lines 961 is sequentially selected for each pixel row (each line) (each pixel switch 964 is turned on), and the gradation voltage signal is supplied to each display element 963 from the data line 962 through the pixel switch 964. The plural pixel rows may be selected by the scanning lines at the same time, or may be driven at a frame frequency of 60 Hz or higher.

In the liquid crystal display device, referring to FIGS. 17A and 17B, the display panel 960 is structured by the semiconductor substrate in which the pixel switches 964 and transparent pixel electrodes 973 are arranged in a matrix as unit pixels, an opposed substrate having one transparent pixel electrode 974 formed on the entire surface, and liquid crystal encapsulated between those opposed two substrates. Each of the display elements 963 includes the pixel electrode 973, the transparent pixel electrode 974, a liquid crystal capacitor 971, and an auxiliary capacitor 972. Also, a backlight is disposed on a rear surface of the display panel as a light source.

When each of the pixel switches 964 is turned on (rendered conductive) according to the scanning signal from the scanning lines 961, the gradation voltage signal is supplied to the pixel electrode 973 from the data lines 962, and the transmittance of the backlight that penetrates through the liquid crystal is changed according to a potential difference between each of the pixel electrodes 973 and the transparent pixel electrode 974. Even after the pixel switch 964 is turned off (rendered nonconductive), the potential difference can be held by the liquid crystal capacitor 971 and the auxiliary capacitor 972 for a given period.

In the drive of the liquid crystal display device, in order to prevent the deterioration of the liquid crystal, a drive (polarity reversal drive) for switching a voltage polarity (positive or negative) for each pixel normally in one frame period is conducted on a common voltage (COM) of the opposed substrate electrode 974. As typical drives, there are a dot inversion drive that is different in the voltage polarity between the adjacent pixels, and a column inversion drive that is different in the voltage polarity between the adjacent data lines. In the dot inversion drive, the gradation voltage signal of the voltage polarity different for each selection period (each data period) is output to the data lines 962. In the column inversion drive, the gradation voltage signal of the same voltage polarity for each selection period (each data period) within one frame period is output to the data lines 962.

In the organic light emitting diode display device, referring to FIGS. 17A and 17C, the display panel 960 is formed of a semiconductor substrate in which the pixel switches 964, organic light emitting diodes (organic EL) 982 each formed of an organic film held between two thin film electrode layers, and thin film transistors (TFTs) 981 that each control a current to be controlled to the organic light emitting diode 982 are arranged in a matrix as the unit pixels. Each of the TFTs 981 and each of the organic light emitting diodes 982 are coupled in series with each other between supply terminals 984 and 985 to which different supply voltages are applied, and an auxiliary capacitor 983 that holds a control terminal voltage of the TFT 981 is further provided. The display element 963 corresponding to one pixel includes the organic light emitting diode 982, the supply terminals 984, 985, and the auxiliary capacitor 983.

When each of the pixel switches 964 is turned on (rendered conductive) according to the scanning signal from the scanning lines 961, the gradation voltage signal is supplied to a control terminal of the TFT 981 from the data lines 962. A current corresponding to the gradation voltage signal is supplied to the organic light emitting diode 982 from the TFT 981, and the organic light emitting diode 982 emits light with luminance corresponding to the current for display. Even after the pixel switch 964 is turned off (rendered nonconductive), the gradation voltage signal supplied to the control terminal of the TFT 981 can be held by the auxiliary capacitor 983 to hold the light emission. The pixel switches 964 and the TFTs 981 are exemplified by re-channel transistors, but can be configured by p-channel transistors. Also, the organic EL element can be coupled to the supply terminal 984 side. Also, in the drive of the organic light emitting diode display device, the polarity inversion drive is not required unlike the liquid crystal display device, and the gradation voltage signal corresponding one-to-one to the video data is output for each selection period (each data period).

Apart from the configuration in which the organic light emitting diode display device conducts display in correspondence with the gradation voltage signals from the data lines 962 described above, the organic light emitting diode display device can conduct display upon receiving the gradation current signal output from the data driver. In the present specification, a description is limited to the configuration in which display is conducted upon receiving the gradation voltage signal output from the data driver. However, it is needless to say that the present invention is not limited to only the above configuration.

In FIG. 17A, the gate driver 970 has only to supply the scanning signal of at least a binary value whereas the data driver 980 is required to drive the respective data lines 962 according to the gradation voltage signal of the multivalued level corresponding to the gradation. For that reason, the data driver 980 includes an output circuit that amplifies the gradation voltage signal corresponding to the video data and outputs the signal to the data lines 962.

In recent years, demand for higher quality has been increased in mobile devices, notebook computers, monitors, and TVs each having the thin-screen display device. More specifically, multicolor (multigradation) of 8 bit video data (about 16,800,000 colors) or more for each of RGB, and demand for increasing a frame frequency (drive frequency for rewriting one screen) to 120 Hz or higher for an improvement in the moving picture characteristic or three-dimensional display compliance have been begun. When the frame frequency becomes N times, one data output period becomes about 1/N.

The voltage output for high precision corresponding to the multigradation and high-speed drive of the data lines are required for the data driver for the display device. For that reason, the high drive performance is required for an output circuit in the data driver 980 in order to charge and discharge the data line capacity at a high speed. Also, in order to uniformize write of the gradation voltage signals into the display elements, the symmetry of the slew rate of the data line drive waveform is also required between the charging time and the discharging time. However, the output circuit increases current consumption with the higher drive performance. For that reason, in this output circuit newly suffers from problems about an increase in the power consumption and the heat generation.

As the output circuit that drives the data line of the display device at a high speed, the following technologies are disclosed. FIG. 18 is a diagram quoting FIG. 5 of Japanese Unexamined Patent Publication No. 2009-244830 (in detail refer to the disclosure of Japanese Unexamined Patent Publication No. 2009-244830). Referring to FIG. 18, an operational amplifier circuit that configures the output circuit includes differential stages 14, 24, a positive dedicated output stage 13, a negative dedicated output stage 23, and switch circuits 3, 4, 5, 6.

The switch circuit 4 includes switches SW41 to SW44, and controls the respective couplings between terminals 41, 42, and input terminals 12, 22 of the differential stages 14, 24. The terminal 41 receives a positive voltage INP (positive DAC signal) from a positive DAC (digital-to-analog converter) not shown, and the terminal 42 receives a negative voltage INN (negative DAC signal) from a negative DAC not shown.

The differential stage 14 outputs, to input stage output terminals 51 and 52, two input stage output signals Vsi11 and Vsi12 of in-phase which are level-shifted to the magnitude corresponding to an input signal Vin1 (positive voltage INP or negative voltage INN) input through the switch circuit 4. The differential stage 24 outputs, to input stage output terminals 53 and 54, two input stage output signals Vsi21 and Vsi22 of in-phase which are level-shifted to the magnitude corresponding to an input signal Vin2 (positive voltage INP or negative voltage INN) input through the switch circuit 4. The differential stages 14 and 24 operate in a voltage range (first supply voltage range) between a negative supply voltage VSS (for example, GND potential) and a positive supply voltage VDD.

The switch circuit 5 includes switches SW51 to SW58. The switches SW51 and SW53 control the respective couplings between the input stage output terminals 51, 52 of the differential stage 14 and output stage input terminals 61, 62 of the positive dedicated output stage 13. The switches SW52 and SW54 control the respective couplings between the input stage output terminals 51, 52 of the differential stage 14 and output stage input terminals 63, 64 of the negative dedicated output stage 23. The switches SW55 and SW57 control the respective couplings between the input stage output terminals 53, 54 of the differential stage 24 and the output stage input terminals 63, 64 of the negative dedicated output stage 23. The switches SW56 and SW58 control the respective couplings between the input stage output terminals 53, 54 of the differential stage 24 and the output stage input terminals 61, 62 of the positive dedicated output stage 13.

The positive dedicated output stage 13 is coupled to the switch circuit 5 through the output stage input terminals 61 and 62, and outputs a single end signal to a terminal 11. The negative dedicated output stage 23 is coupled to the switch circuit 5 through the output stage input terminals 63 and 64, and outputs the single end signal to a terminal 21. The positive dedicated output stage 13 operates in a voltage range (second voltage range) between a supply voltage VML and the positive supply voltage VDD, and the negative dedicated output stage 23 operates in a voltage range (third voltage range) between the negative supply voltage VSS and the supply voltage VMH. The supply voltage VML is set to, for example, an intermediate voltage VSS+(VDD-VSS)/2 or lower between the negative supply voltage VSS and the positive supply voltage VDD. The supply voltage VMH is set to, for example, the intermediate voltage VSS+(VDD-VSS)/2 or higher between the negative supply voltage VSS and the positive supply voltage VDD.

The switch circuit 6 includes switches SW61 to SW64, and controls the respective couplings between input terminals (−) of the differential stages 14 and 24 that function as inverting input terminals when functioning as a feedback amplifier circuit, and the output terminals 11 and 21.

The switch circuit 3 includes switches SW31 to SW34, and controls the respective couplings between the output terminals 11, 21 of the output stages 13, 23, and an odd terminal 31, an even terminal 32. The odd terminal 31 and the even terminal 32 are coupled to respective drain lines (data lines) on an LCD panel.

The differential stages 14, 24, and the output stages 13, 23 form an amplifier circuit by the switch circuits 3, 4, 5, and 6. An operational amplifier circuit 100 (output circuit) can change the configuration of the amplifier circuit that drives the odd terminal 31 and the even terminal 32 with a change in the combination of couplings of the switch circuits 3, 4, 5, and 6. That is, during the data line drive, the coupling is switched between a pattern 1 (coupling mode 1) and a pattern 2 (coupling mode 2). In the pattern 1, the switches SW31, SW33, SW41, SW43, SW51, SW53, SW57, SW55, SW61, and SW63 are on, and the switches SW32, SW34, SW42, SW44, SW52, SW54, SW56, SW58, SW62, and SW64 are off. In the pattern 2, the states of on and off are opposite. In the pattern 1, the positive DAC signal is transmitted through a path of the terminal 41, the differential stage 14, the positive dedicated output stage 13, the output terminal 11, and the terminal 31, and the negative DAC signal is transmitted through a path of the terminal 42, the differential stage 24, the negative dedicated output stage 23, the output terminal 21, and the terminal 32. In the pattern 2, the positive DAC signal is transmitted through a path of the terminal 41, the differential stage 24, the positive dedicated output stage 13, the output terminal 11, and the terminal 32, and the negative DAC signal is transmitted through a path of the terminal 42, the differential stage 14, the negative dedicated output stage 23, the output terminal 21, and the terminal 31. The pattern 1 and the pattern 2 are switched in synchronism with the inversion of the polarity of the input voltage (output voltage).

FIG. 19 is a diagram quoting FIG. 6 of Japanese Unexamined Patent Publication No. 2009-244830. In FIG. 19, the configuration of FIG. 18 is represented by transistor level, and the switch circuits 3 and 4 in FIG. 18 are omitted. The present invention described later is applicable to the configuration of FIG. 19, and therefore this configuration will be described below. The details are referred to the disclosure of Japanese Unexamined Patent Publication No. 2009-244830.

The differential stage 14 includes NMOS transistors MN11, MN12, MN13, MN15, MN16, PMOS transistors MP11, MP12, MP13, MP15, MP16, constant current sources I11, I12, a floating current source I13, and switches SW11, SW12. The NMOS transistors MN11 and MN12 have the respective gates coupled to the switch circuit 6 and an input terminal 12 to form an Nch differential pair. The constant current source I11 receives the negative supply voltage VSS, and supplies a bias current to Nch differential pair transistors (NMOS transistors MN11, MN12). The PMOS transistors MP11 and MP12 have the respective gates coupled to the switch circuit 6 and the input terminal 12 to form a Pch differential pair. The constant current source I12 receives the positive supply voltage VDD, and supplies a bias current to Pch differential pair transistors (PMOS transistors MP11, MP12). The gates of the NMOS transistor MN11 and the PMOS transistor MP11 are coupled to the output terminal 11 or the output terminal 21 by the switch circuit 6.

The sources of the PMOS transistors MP15 and MP16 are commonly coupled to a supply terminal 15 (positive supply voltage VDD), and the drains thereof are coupled to the respective drains of the Nch differential pair transistors (NMOS transistors MN11, MN12). Also, the drain of the PMOS transistor MP15 is coupled to the floating current source I13 through the switch SW11 and the PMOS transistor MP13. Further, the gates of the PMOS transistors MP15 and MP16 are commonly coupled to the drains of the floating current source I13 and the PMOS transistor MP13. With the above configuration, the PMOS transistors MP15 and MP16 function as an active load of a folded cascade coupling. A bias voltage BP2 is applied to the gate of the PMOS transistor MP13.

The sources of the NMOS transistors MN15 and MN16 are commonly coupled to a supply terminal 16 (negative supply voltage VSS), and the drains thereof are coupled to the respective drains of the Pch differential pair transistors (PMOS transistors MP11, MP12). Also, the drain of the NMOS transistor MN15 is coupled to the floating current source I13 through the switch SW12 and the NMOS transistor MN13. Further, the gates of the NMOS transistors MN15 and MN16 are commonly coupled to the drains of the floating current source I13 and the NMOS transistor MN13. With the above configuration, the NMOS transistors MN15 and MN16 function as an active load of a folded cascade coupling. A bias voltage BN2 is applied to the gate of the NMOS transistor MN13. The switches SW11 and SW12 are normally on.

The drains of the NMOS transistor MN12 and the PMOS transistor MP16 are coupled to an input stage output terminal 51, and coupled to the positive dedicated output stage 13 (source of the PMOS transistor MP14) and the negative dedicated output stage 23 (source of the PMOS transistor MP24) through the switches SW51 and SW52. The drains of the PMOS transistor MP12 and the NMOS transistor MN16 are coupled to an input stage output terminal 52, and coupled to the positive dedicated output stage 13 (source of the NMOS transistor MN14) and the negative dedicated output stage 23 (source of the NMOS transistor MN24) through the switches SW53 and SW54. With the above configuration, two input stage output signals Vsi11 and Vsi12 corresponding to the input signal Vin1 input to the input terminal 12 are output from the drains (input stage output terminal 51) of the NMOS transistor MN12 and the PMOS transistor MP16, and the drains (input stage output terminal 52) of the PMOS transistor MP12 and the NMOS transistor MN16.

The same configuration is applied to the differential stage 24. The NMOS transistors MN11 to MN16, the PMOS transistors MP11 to MP16, the constant current sources I11, I12, the floating current source I13, the switches SW11, SW12, SW51 to SW54, bias voltages BP12, BN12, the input stage output terminals 51, 52, and the input stage output signals Vsi11, Vsi12 are replaced with the NMOS transistors MN21 to MN26, the PMOS transistors MP21 to MP26, the constant current sources I21, I22, the floating current source I23, the switches SW21, SW22, SW55 to SW58, bias voltages BP22, BN22, the input stage output terminals 53, 54, and the input stage output signals Vsi21, Vsi22, respectively.

The differential stage 14(24) has two differential pairs that receives the input signal Vin1 (Vin2), and has an active load that is folded-cascade-coupled to each of the differential pairs. The two differential pairs and the active load are each configured by a transistor different in the conduction type from each other. For that reason, two input stage output signals Vi11 and Vi12 (Vi21, Vi22) which are input from the differential stage 14(24) to the output stage 13 or 23 are in-phase signals different in the input level.

In the differential stage 14(24), when the voltage range of the input signal Vin1 (Vin2) is VSS~VDS(sat)+VGS, only the Pch differential pairs (PMOS transistors MP11, MP12 (MP21, MP22)) operate. When the voltage range is VDS(sat)+VGS+VDD−(VDS(sat)+VGS), both of the Pch differential pairs (PMOS transistors MP11, MP12 (MP21, MP22)) and the Nch differential pairs (NMOS transistors MN11, MN12 (MN21, MN22)) operate. When the voltage range is VDD−(VDS(sat)+VGS)~VDD, only the Nch differential pairs (NMOS transistors MN11, MN12 (MN21, MN22)) operates. In this case, VDS(sat) is a source-drain voltage in the turn of a triode region and a pentode region of the MOS transistor included in the constant current sources I11 and I12 (I21, I22), and VGS is a gate-source voltage of the transistors (NMOS transistor MN11, MN12 (MN21, MN22), PMOS transistor MP11, MP12 (MP21, MP22)) forming the differential pair. As a result, the differential stages 14 and 24 rail-to-rail operate in an entire voltage range of VSS-VDD of the input voltage.

The positive dedicated output stage 13 includes the NMOS transistors MN14, MN17, MN18, the PMOS transistors MP14, MP17, MP18, and phase compensation capacitors C1, C2. The drains and sources of the PMOS transistor MP17 and the NMOS transistor MN17 are mutually coupled to each other, and bias voltages BP11 and BN11 are applied to the respective gates, thereby functioning as a floating current source. The gate of the PMOS transistor MP14 is coupled to a bias constant voltage source (bias voltage BP12), and the drain thereof is coupled to one end of the floating current source (PMOS transistor MP17 and NMOS transistor MN17). The gate of the NMOS transistor MN14 is coupled to a bias constant voltage source (bias voltage BN12), and the drain thereof is coupled to the other end of the floating current source (PMOS transistor MP17 and NMOS transistor MN17). Also, the source of the PMOS transistor MP14 is coupled to the output terminal 11 through the phase compensation capacitor C11, and the source of the NMOS transistor MN14 is coupled to the output terminal 11 through the phase compensation capacitor C12.

The drain of the PMOS transistor MP18 and the drain of the NMOS transistor MN18 are coupled to each other through the output terminal 11. The gate of the PMOS transistor MP18 is coupled to one end (and the drain of the PMOS transistor MP14) of the floating current source, and the source thereof is coupled to the supply terminal 15 (positive supply voltage VDD). The gate of the NMOS transistor MN18 is coupled to the other end (and the drain of the NMOS transistor MN14) of the floating current source, and the source thereof is coupled to the supply terminal 17 to which the supply voltage VML is applied.

The same configuration is applied to the negative dedicated output stage 23. The NMOS transistors MN14, MN17, MN18, the PMOS transistors MP14, MP17, MP18, the phase compensation capacitors C11, C12, the supply terminal 15 (positive supply voltage VDD), the supply terminal 17 (supply voltage VML), and the bias voltages BP11, BP12, BN11, and BN12 are replaced with the NMOS transistors MN24, MN27, MN28, the PMOS transistors MP24, MP27, MP28, the phase compensation capacitors C21, C22, the supply terminal 16 (negative supply voltage VSS), the supply terminal 18 (supply voltage VMH), and the bias voltages BP21, BP22, BN21, and BN22, respectively.

The switch SW61 of the switch circuit 6 controls the coupling between the output terminal 11 and the differential stage 14 (NMOS transistor MN11, PMOS transistor MP11). The switch SW62 controls the coupling between the output terminal 11 and the differential stage 24 (NMOS transistor MN21, PMOS transistor MP21). The switch SW63 controls the coupling between the output terminal 21 and the differential stage 24 (NMOS transistor MN21, PMOS transistor MP21). The switch SW64 controls the coupling between the output terminal 21 and the differential stage 14 (NMOS transistor MN11, PMOS transistor MP11).

The PMOS transistor MP14 (MP24) and NMOS transistor MN14 (MN24), and the PMOS transistor MP18 (MP28) and the NMOS transistor MN18 (MN28) in the output stage 13(23) are symmetrically formed with respect to the output terminal 11(21), respectively. The output stage 13(23) outputs a single end signal based on the two input stage output signals Vsi11 and Vsi12 (Vsi21, Vsi22) of in-phase which are different in the input level to the output terminal 11(21) as the output signal Vout1 (Vout2). In this situation, idling currents of the PMOS transistor MP18 (MP28) and the NMOS transistor MN18 (MN28) are determined according to the bias voltages BP11 and BN11 (BP21, BN21).

In the operational amplifier circuit described with reference to FIGS. 18 and 19, the drive power supply can be provided according to the positive and negative dynamic range. The supply voltage range of the positive dedicated output stage 13 can be reduced to VDD-VML (for example, VML=VDD/2) with respect to the supply voltage range VDD-VSS of the differential stages 14 and 24. As a result, the power consumption in the positive dedicated output stage 13 is reduced. Likewise, the supply voltage range of the negative dedicated output stage 23 can be reduced to VMH-VSS (for example, VMH=VDD/2). As a result, the power consumption in the negative dedicated output stage 23 is reduced.

FIG. 20 is a diagram quoting FIG. 3 of Japanese Unexamined Patent Publication No. 2008-271224, as an example of the output circuit having a MOS transistor and a switch diode-coupled between a gate of an output stage transistor and a supply voltage. Referring to FIG. 20, the output circuit includes an input terminal that receives an input signal, an output transistor MPout that is coupled between a supply voltage Vdd and an output terminal, and a current control circuit 10 that is coupled to the input terminal and a gate of the output transistor MPout, and controls the incoming and outgoing of a current with respect to the gate of the output transistor MPout on the basis of the input signal. The output circuit also includes a voltage generator circuit 12 (configured by two stages of PMOS transistors which are diode-coupled) coupled to the supply voltage Vdd, a switch (PMOS transistor) S2 that is coupled between the gate of the output transistor MPout and the voltage generator circuit 12, and has an open/close state controlled according to the input signal, and a capacitor C1 that is coupled between the gate of the output transistor MPout and the supply voltage gnd. A load is coupled between the output terminal and supply voltage gnd.

When a potential difference between the gate of the output transistor MPout and the supply voltage Vdd becomes a given value or lower, the switch S2 turns off regardless of the voltage level of the input signal. Also, PMOS transistors D3 and D4 which are diode-coupled between the gate of the output transistor MPout and the supply voltage Vdd, and the switch (PMOS transistor) S2 are disposed in series. A gate of the switch S2 receives the input signal (step signal) from the input terminal, and the on/off operation of the switch S2 is controlled according to the input signal.

More specifically, when the input signal changes to a high level, the transistors S11 and S12 of the current control circuit 10 turn on and off, respectively, and the switch S2 turns off. Electric charge is discharged from the capacitor C1 by the current source Is11 of the current control circuit 10 with the result that the gate voltage of the output transistor MPout gently decreases from the supply voltage Vdd to the supply voltage gnd. In this situation, when the gate voltage of the output transistor MPout decreases from the supply voltage VDD by a threshold voltage (absolute value), the output transistor MPout turns on, and the voltage of the output terminal changes to the high level.

On the other hand, when the input signal changes to a low level, the transistors S11 and S12 of the current control circuit 10 turn off and on, respectively, and the switch S2 turns on. When the switch S2 turns on, the gate voltage of the output transistor MPout is instantaneously pulled up from the supply voltage gnd to a given voltage level determined by the voltage generator circuit 12. Thereafter, electric charge is charged into the capacitor C1 by the current source Is12 of the current control circuit 10 with the result that the gate voltage of the output transistor MPout gently increases up to the supply voltage Vdd. In this situation, when the gate voltage of the output transistor MPout increases to a voltage lower than the supply voltage VDD by the threshold voltage (absolute value), the output transistor MPout turns off, and the voltage of the output terminal changes to the low level due to the load. When the gate voltage of the output transistor MPout further increases after pulling up to the given voltage level, the voltage generator circuit 12 is rendered inactive (two stages of PMOS transistors D3 and D4 which are diode-coupled turn off), and the switch S2 is also rendered inactive. That is, the switch (PMOS transistor) S2 is activated during only a period in which the input signal input to the gate is low level. Also, the switch (PMOS transistor) S2 is deactivated with the deactivation of the voltage generator circuit 12 even during the period in which the input signal is low level. The switch S2 is always held off during a period in which the input signal is high level. Also, the operation when the switch S2 is activated affects only the control of the gate voltage of the output transistor MPout that conducts the charging operation of the output terminal, and does not affect the load that conducts the discharging operation of the output terminal.

SUMMARY

Hereinafter, the analysis of the related art conducted by the present inventors will be described.

In the output circuit of the related art illustrated in FIGS. 18 and 19, the supply voltage VML of the positive dedicated output stage 13 and the supply voltage VMH of the negative dedicated output stage 23 are made lower than the supply voltage ranges of the differential stages 14 and 24 according to the respective output voltage ranges of positive and negative (for example, VML=VMH=VDD/2), thereby enabling a reduction in the power consumption at the positive dedicated output stage 13 and the negative dedicated output stage 23. However, in the output circuit of the related art illustrated in FIGS. 18 and 19, in the case where a heavy load (large-capacity load) such as the data lines of the large-screen liquid crystal display device is driven at a high speed (for example, column inversion drive), when the positive input voltage Vin1 (Vin2) changes from the vicinity of the supply voltage VDD to the vicinity of the supply voltage VML in the positive voltage output operation, a falling waveform of the positive output voltage signal Vout1 output from the terminal 11 may be delayed. Also, when the negative input voltage Vin1 (Vin2) changes from the vicinity of the supply voltage VSS to the vicinity of the supply voltage VMH in the negative voltage output operation, a rising waveform of the negative output voltage signal Vout2 output from the terminal 21 may be delayed. There is a possibility that the occurrence of this output signal delay leads to the deterioration of the display quality of the liquid crystal display device.

The present inventors that have known the above problem with the related art illustrated in FIGS. 18 and 19 have studied the problem through circuit simulation in order to really validate the evidence. FIGS. 21A to 21D are diagrams illustrating the simulation results (transient analysis results), and a diagram illustrating voltage waveforms when driving the load of a positive side output circuit (differential stage 14 and positive dedicated output stage 13) when the column inversion drive is conducted with the heavy load such as the data lines of the large-screen liquid crystal display device and at a high drive frequency in the related art illustrated in FIG. 19. Although being not particularly limited, the VDD is set to 16V, the VSS is set to 0 V, and the VML is set to 8 V. The load is configured by a data line load (wiring equivalent circuit configured by multistage of resistors and capacitors) with a total capacity of 200 pF (Pico farad) and a total resistance of 10 kΩ (kilo-ohm), and the output voltage signal of the output circuit is supplied to a near end of the data line load.

FIG. 21A represents the on/off states of the input switch SW41, and corresponds to an input switch control signal (digital signal) for controlling the on/off states of the input switch SW41 (amplitude is the supply voltage VDD-VSS). The input switch SW41 is turned on/off according to the high/low level of the input switch control signal. One output period is set to 2 μs (microseconds), and the on/off operation of the input switch SW41 is controlled for each output period. The input switch SW41 (similarly, SW42, SW43, and SW44) is turned off for a given period immediately after switching the output period in which the selected voltage of the DAC is changed (input switch control signal=low), a transition noise of the DAC selected voltage is prevented from being input to the output circuit. Thereafter, the input switch SW41 is turned on (input switch control signal=high), and the selected voltage (positive input voltage) of the positive DAC is input to the differential stage 14. Although the input signal is not illustrated in FIG. 21, the input signal is input to the differential stage 14 in a step waveform immediately after the input switch control signal transits from low to high to turn on the input switch SW41. The input switch SW41 can be configured by a CMOS (parallel coupling of the NMOS transistor and the PMOS transistor) configuration or a PMOS transistor, and FIG. 21A illustrates a gate input signal of the NMOS transistor having the COMS configuration. The gate input signal (accordingly, the input switch control signal) of the input switch SW41 configured by the PMOS transistor is a reversed phase signal of FIG. 21A.

FIG. 21B is a voltage waveform of the output signal Vout1 of the positive dedicated output stage 13 coupled to the differential stage 14 in FIG. 19. FIG. 21B illustrates voltage waveforms of the output signal Vout1 when (a) the load (data line load coupled to the terminal 11) is AC-driven every one output period (2 μs), and when (b) the load (data line load coupled to the terminal 11) is AC-driven every three output periods (6 μs).

FIG. 21C is a gate voltage waveform of the PMOS transistor MP18 of the positive dedicated output stage 13 in FIG. 19. FIG. 21C is gate voltage waveforms of the PMOS transistor MP18 when (a) the load (data line load coupled to the terminal 11) is AC-driven every one output period (2 μs), and when (b) the load (data line load coupled to the terminal 11) is AC-driven every three output periods (6 μs).

FIG. 21D is a gate voltage waveform of the NMOS transistor MN18 of the positive dedicated output stage 13 in FIG. 19. FIG. 21D illustrates the gate voltage waveforms of the NMOS transistor MN18 when (a) the load (data line load coupled to the terminal 11) is AC-driven every one output period (2 μs), and when (b) the load (data line load coupled to the terminal 11) is AC-driven every three output periods (6 μs).

In the related art of FIGS. 18 and 19, the differential stage 14 (24) operates with the supply voltage VDD(16V)~VSS (0V), and the load (data line load coupled to the terminal 11) is AC-driven in the vicinity of the supply voltage VDD (16V) and the supply voltage VML (8V), the gate voltages of the PMOS transistor MP18 and the NMOS transistor MN18 in the positive dedicated output stage 13 are decreased to the supply voltage VML (8V) or lower at the source side of the NMOS transistor MN18 (FIGS. 21C and 21D).

As illustrated in FIGS. 21C and 21D, the gate voltage waveform (a) of the PMOS transistor MP18 and the gate voltage waveform (a) of the NMOS transistor MN18 in the positive dedicated output stage 13 are decreased to the supply voltage VML (8V) or lower at a time of about 6 to 7 μs, about 10 to 11 μs, and about 14 to 15 μs (one scale of time axis is 0.3 μs) when the load is AC-driven every one output period (2 μs). Also, when the load is AC-driven every three output periods (6 μs) (waveform (b)), the gate voltage waveforms are decreased to the supply voltage VML (8V) or lower at a time of about 14 to 16 μs. In particular, attention is paid to a time of about 7 μs (timing tx-tx') at which the respective output periods change from the load charging operation for the vicinity of the supply voltage VDD (16V) to the load discharging operation for the vicinity of the supply voltage VML (8 V). In this case, if the load is AC-driven every one output period (2 μs) (waveform (a)), the charging operation at a far end of the data line load is not completed at a time of about 7 μs (timing tx). Therefore, the gate voltages of the PMOS transistor MP18 and the NMOS transistor MN18 in the positive dedicated output stage 13 are largely decreased (the gate voltage of the MP18 is a level allowing the MP18 to be on, and the gate voltage of the MN18 is a level allowing the MN18 to be off).

For that reason, in a subsequent output period of the load discharging operation, the respective gate voltages of the PMOS transistor MP18 and the NMOS transistor MN18 increase from that state. Then, the load discharging operation due to the NMOS transistor MN18 does not start until the respective gate voltages reach a voltage level allowing the PMOS transistor MP18 to turn off, and a voltage level allowing the NMOS transistor MN18 to turn on (timing tx'). As a result, the falling edge of the voltage waveform (waveform (a) of FIG. 21B) of the output signal Vout1 is delayed.

On the other hand, in FIGS. 21C and 21D, when the load is AC-driven every three output periods (6 μs), the charging operation of the load is conducted through the three output periods (6 μs). Therefore, the charging operation at the far end of the data line load is completed at the time of 7 μs (timing tx), and the gate voltages (FIGS. 21C and 21D) of the PMOS transistor MP18 and the NMOS transistor MN18 in the positive dedicated output stage 13 are the respective voltage levels of the output stable state (for example, the vicinity of the voltage level obtained by subtracting an absolute value of the threshold voltage of the PMOS transistor MP18 from the VDD, and the vicinity of the voltage level obtained by adding the threshold voltage of the NMOS transistor MN18 to the VML). For that reason, in the subsequent output period that is the load discharging operation, the NMOS transistor MN18 turns on promptly immediately after the time 7 μs (timing tx), the load discharging operation starts, and there occurs no delay, unlike AC-drive of every one output period (2 μs), at the falling edge of the voltage waveform of the output signal Vout1 (waveform (b) of FIG. 21B).

In the related art of FIGS. 18 and 19, when the load is AC-driven in the voltage ranges of the vicinity of the supply voltage VDD (16 V) and the vicinity of the supply voltage VML (8 V), the gate voltages of the PMOS transistor MP18 and the NMOS transistor MN18 in the positive dedicated output stage 13 increase to the source side supply voltage VDD (16 V) of the PMOS transistor MP18 during the discharging operation of the load (FIGS. 21C and 21D).

In FIGS. 21C and 21D, attention is paid to a time of 13 μs (timing ty) at which the output period changes from the discharging operation for the vicinity of the supply voltage VML (8 V) to the charging operation for the vicinity of the supply voltage VDD (16 V). In this case, if the load is AC-driven every one output period (2 μs) (waveform (a)), the load discharging operation is not completed at a time of 13 μs (timing ty). Therefore, both of the gate voltages (FIGS. 21C and 21D) of the PMOS transistor MP18 and the NMOS transistor MN18 in the positive dedicated output stage 13 are largely increased (PMOS transistor MP18 is off, and NMOS transistor MN18 is on). However, in the subsequent output period of the load charging operation, the PMOS transistor MP18 turns on, and the NMOS transistor MN18 turns off to start the load charging operation relatively promptly immediately after the time 13 μs (timing ty), and the delay of the rising edge of the voltage waveform (waveform (a) of FIG. 21B) of the output signal Vout1 is sufficiently small.

On the other hand, when the load is AC-driven every three output periods (6 μs) (waveform (b)), the load discharging operation is conducted through the three output periods (6 μs). Therefore, the discharging operation of the load is completed at the time of 13 μs (timing ty), and the gate voltages (FIGS. 21C and 21D) of the PMOS transistor MP18 and the NMOS transistor MN18 in the positive dedicated output stage 13 are the respective voltage levels of the output stable states. For that reason, in the subsequent output period of the load charging operation, the load charging operation starts promptly immediately after the time 13 μs (timing ty), and the voltage waveform (waveform (b) of FIG. 21B) of the output signal Vout1 rises from the timing ty without any remarkable delay.

That is, in FIG. 21B, a delay of Δt(=tx'−tx) occurs at the falling edge of the voltage waveform (waveform (a)) of the output signal Vout1 when the load is AC-driven every one output period (2 μs). However, there occurs no delay in the falling edge of the voltage waveform (waveform (b)) of the output signal Vout1 when the load is AC-driven every three output periods (6 μs).

Also, the delay of the rising edge of the voltage waveform (waveform (a)) of the output signal Vout1 when the load is AC-driven every one output period (2 μs) is sufficiently small, and there occurs no delay in the rising edge of the voltage waveform (waveform (b)) of the output signal Vout1 when the load is AC-driven every three output periods (6 μs).

The main cause is that when the input signal (positive DAC signal voltage) in the vicinity of the high supply voltage VDD is input (during the charging operation of the load coupled to the output terminal), the gate voltages of the output transistors MP18 and MN18 in the positive dedicated output stage 13 transiently decrease to voltages lower than the intermediate supply voltage VML which is a lower limit of the positive output voltage range.

In the high-speed drive of the heavy load such as the data lines in the large-screen liquid crystal display device, a voltage change at the load near-end is fast, but a voltage change at the load far-end is slow, and the drive may be changed to drive of the subsequent input signal (positive DAC signal voltage) before the charging of the load far-end is completed. In this case (at the time of switching the subsequent input signal), the gate voltages of the output transistors MP18 and MN18 of the positive dedicated output stage 13 are being largely decreased in order to turn on the output transistor MP18 to supply a current (charging current) to the load far-end from the high supply voltage VDD side. In this situation, in order to increase the charging current from the output transistor MP18 under a feedback control (the operation of voltage follower) in which the positive DAC signal voltage near the high supply voltage VDD that is the input signal before switching is made equal to the voltage of the output terminal 11, the gate voltage of the output transistor MP18 approaches the VSS side (becomes lower than VML), and the gate voltage of the output transistor MN18 also approaches the VSS side (becomes lower than VML) through the floating current source (PMOS transistor MP17 and NMOS transistor MN17). For that reason, even if the subsequent input signal is switched to a low voltage from the input signal (vicinity of the high supply voltage VDD), both of the gate voltages of the output transistors MP18 and MN18 are lower in potential than the intermediate supply voltage VML at the switching time. After switching, the gate voltages of the output transistors MP18 and MN18 increase from the lower potential according to the subsequent input signal (lower voltage). A delay (tx'−tx in FIG. 21) occurs until the output transistors MP18 and MN18 turn off and on, respectively, and the discharging operation of the output terminal 11 cannot be immediately conducted. As a result, the output signal is delayed in switching from the charging operation of the output terminal (load) to the discharging operation in the high-speed drive.

On the other hand, when the positive DAC signal voltage near the intermediate supply voltage VML is input (the discharging operation of the output terminal 11), the gate voltages of the output transistors MP18 and MN18 in the positive dedicated output stage 13 increase up to the high supply voltage VDD as illustrated in FIGS. 21C and 21D, but do not increase more than the high supply voltage VDD, and fall within a positive output voltage range. For that reason, in this stage, even if the subsequent input signal (positive DAC signal voltage) is changed to the vicinity of the high supply voltage VDD, a large output signal delay hardly occurs.

Although being not illustrated in the simulation results, even if the negative DAC signal voltage near the low supply voltage VSS and the negative DAC signal voltage near the intermediate supply voltage VMH are alternately input, there occurs a delay in the rising waveform when the operation switches from the load discharging operation to the load charging operation in the output signal when the load is AC-driven every one output period (2 μs). This is for the following reasons. That is, the gate voltages of the output stage transistors MP28 and MN28 in the negative dedicated output stage 23 of FIG. 19 approach the high supply voltage VDD side during the discharging operation of the load, and increase higher than the intermediate supply voltage VMH.

In this state, when the operation switches from the load discharging operation to the load charging operation by switching the negative DAC signal voltage, because both of the gate voltages of the output transistors MP28 and MN28 are higher in potential than the VMH at the switching time, a delay occurs until the gate voltages of the output transistors MP28 and MN28 decrease, and the output transistors MP28 and MN28 turn on and off, respectively. As a result, the charging operation of the output terminal 21 cannot be immediately conducted.

In the high-speed drive (column inversion drive) of the heavy load such as the data lines in the large-screen liquid crystal display device, in the output circuit of the related art illustrated in FIGS. 18 and 19, when the positive DAC signal voltage near the high supply voltage VDD is switched to the positive DAC signal voltage near the intermediate supply voltage VML, no delay occurs in the falling waveform of the output signal if the signal voltage is switched every plural output periods (for example, three output periods (6 μs)) as illustrated in FIG. 21B ((b) in FIG. 21B). On the other hand, if the signal voltage is switched every one output period (2 μs), a delay occurs in the falling waveform of the output signal ((a) in FIG. 21B).

For that reason, even if the output circuit drives the data lines with the same gradation voltage, there are a case in which the delay occurs in the output signal and a case in which no delay occurs therein, according to the gradation voltage level of the output period before switching. Also, there are a case in which a delay occurs in the signal (data signal) to be supplied to pixels selected by the scanning lines and coupled to the data lines from the output circuit, and a case in which no delay occurs therein. In this way, the write ratio to the pixel with the same gradation voltage is different according to whether the output signal from the output circuit is delayed, or not, resulting in a possibility that display is uneven. That is, when the output signal from the output circuit rises, for example, from the intermediate supply voltage VML side to the gradation voltage at the high supply voltage VDD side, the output signal is not delayed, and the write operation to the pixels is normally conducted. However, when the gradation voltage falls from the VDD side to the VML side, there occurs a situation in which the write to the pixels is short as compared with the normal state due to waveform rounding caused by the delay of the output signal. Similarly, when the negative DAC signal voltage near the low supply voltage VSS is switched to the negative DAC signal voltage near the intermediate supply voltage VMH, a delay occurs in the rising waveform of the output signal, and the write ratio to the pixel with the same gradation voltage is different according to whether the output signal from the output circuit is delayed, or not, resulting in a possibility that display is uneven.

In the output circuit (operational amplifier circuit) of the related art illustrated in FIGS. 18 and 19, in the simulation of FIG. 21, in the positive voltage output operation, the supply voltage range (VDD~VSS) of the differential stage 14(24) is different from the supply voltage range (VDD~VML) of the positive dedicated output stage 13. Therefore, as compared with the output signal when the output terminal 11 switches from the discharging operation to the charging operation, a delay is particularly liable to occur in the output signal when the output terminal 11 switches from the charging operation to the discharging operation. Likewise, in the negative voltage output operation, the supply voltage range (VDD~VSS) of the differential stage 14(24) is different from the supply voltage range (VMH~VSS) of the negative dedicated output stage 23. Therefore, as compared with the output signal when the output terminal 11 switches from the charging operation to the discharging operation, a delay is particularly liable to occur in the output signal when the output terminal 21 switches from the discharging operation to the charging operation.

Further, according to the analysis of the present inventors, because of higher-speed drive (further reduction in one output period), and/or an increase in the load capacity of the data lines, in the output circuit of the related technology illustrated in FIGS. 18 and 19, even if the output terminal 11 switches from the discharging operation to the charging operation in the positive voltage output operation, and even if the output terminal 11 switches from the charging operation to the discharging operation in the negative voltage output operation, there is a sufficient possibility that the delay of the output signal becomes pronounced.

Also, even in the output circuit in which the supply voltage ranges of the differential stage and the output stage are identical with each other (VML=VSS or VMH=VDD), similarly, there is a sufficient possibility that the delay of the output signal becomes pronounced.

The above-mentioned delays of the output signal from the output circuit cause a bottleneck of higher-speed drive of the data driver, and may cause the deterioration of an image quality.

Further, the drive of the data line load by the output circuit in which the supply voltage ranges of the differential stage and the output stage are identical with each other (for example, VDD/VSS) corresponds to the dot inversion drive of the liquid crystal display device, or the drive of the organic light emitting diode display device, and in those drives, there is a possibility that the write to the pixels is short due to the delay when the output signal of the output circuit switches between the charging operation and the discharging operation.

Accordingly, a main object of the present invention is to provide an output circuit that suppresses a delay of an output signal at the time of switching between the charging operation and the discharging operation, and a data driver and a display device each having the output circuit.

The present invention that solves at least one of the above problems is roughly configured as follows although being not limited to the following configuration.

According to an aspect of the present invention, there is provided an output circuit: including a differential amplifier circuit; an output amplifier circuit; a first control circuit; an input terminal; an output terminal; and first to third supply terminals to which first to third supply voltages are applied, in which the third supply voltage is set to a voltage between the first supply voltage and the second supply voltage, or the second supply voltage, the differential amplifier circuit includes a differential input stage having a differential input pair with a first input and a second input to which an input signal of the input terminal and an output signal of the output terminal are input, respectively, and first and second current mirrors having transistor pairs of first and second conduction types, respectively, which are coupled to the first and second supply terminals, respectively, at least one of the first and second current mirrors receives an output current of the differential input stage, and includes a first connection circuit that connects between an input of the first current mirror and an input of the second current mirror, and a second connection circuit that connects between an output of the first current mirror and an output of the second current mirror, the output amplifier circuit includes a first transistor of the first conduction type coupled between the first supply terminal and the output terminal, and having a control terminal coupled to a coupling point between an output node of the first current mirror and one end of the second connection circuit, and a second transistor of the second conduction type coupled between the output terminal and the third supply terminal, and having a control terminal coupled to the other end of the second connection circuit, the first control circuit includes a third transistor and a first switch which are coupled in series between the first supply terminal and the control terminal of the first transistor, the first switch is kept on for a given period since start of an output period in which the output signal corresponding to the input signal is output from the output terminal, kept off for the remaining period of the output period, in the given period in which the first switch is kept on, the control terminal of the first transistor is electrically conductive to the first supply terminal through the third transistor having a control terminal and a first terminal coupled thereto in a diode coupling mode, and in the remaining period of the output period in which the first switch is kept off, a current path of the third transistor between the first supply terminal and the control terminal of the first transistor is cut off.

According to the aspect of the present invention, there is provided a data driver having the multiple output circuits. According to the aspect of the present invention, there is provided a display device having the data driver.

According to the aspect of the present invention, the output signal can be prevented from being delayed at the time of switching between the charging operation and the discharging operation of the load.

BRIEF DESCRIPTION OF THE DRAWINGS

FIGS. 10A to 10D are diagrams illustrating simulation waveforms according to the first embodiment of the present invention;

FIGS. 11A to 11D are diagrams-illustrating simulation waveforms according to the third embodiment of the present invention, and a comparative example;

FIGS. 17A to 17C are diagrams illustrating a liquid crystal display device, and configurations of pixels, respectively;

FIGS. 21A to 21D are diagrams illustrating execution results of a circuit simulation conducted for analysis of the one related art.

DETAILED DESCRIPTION

Figure 1:
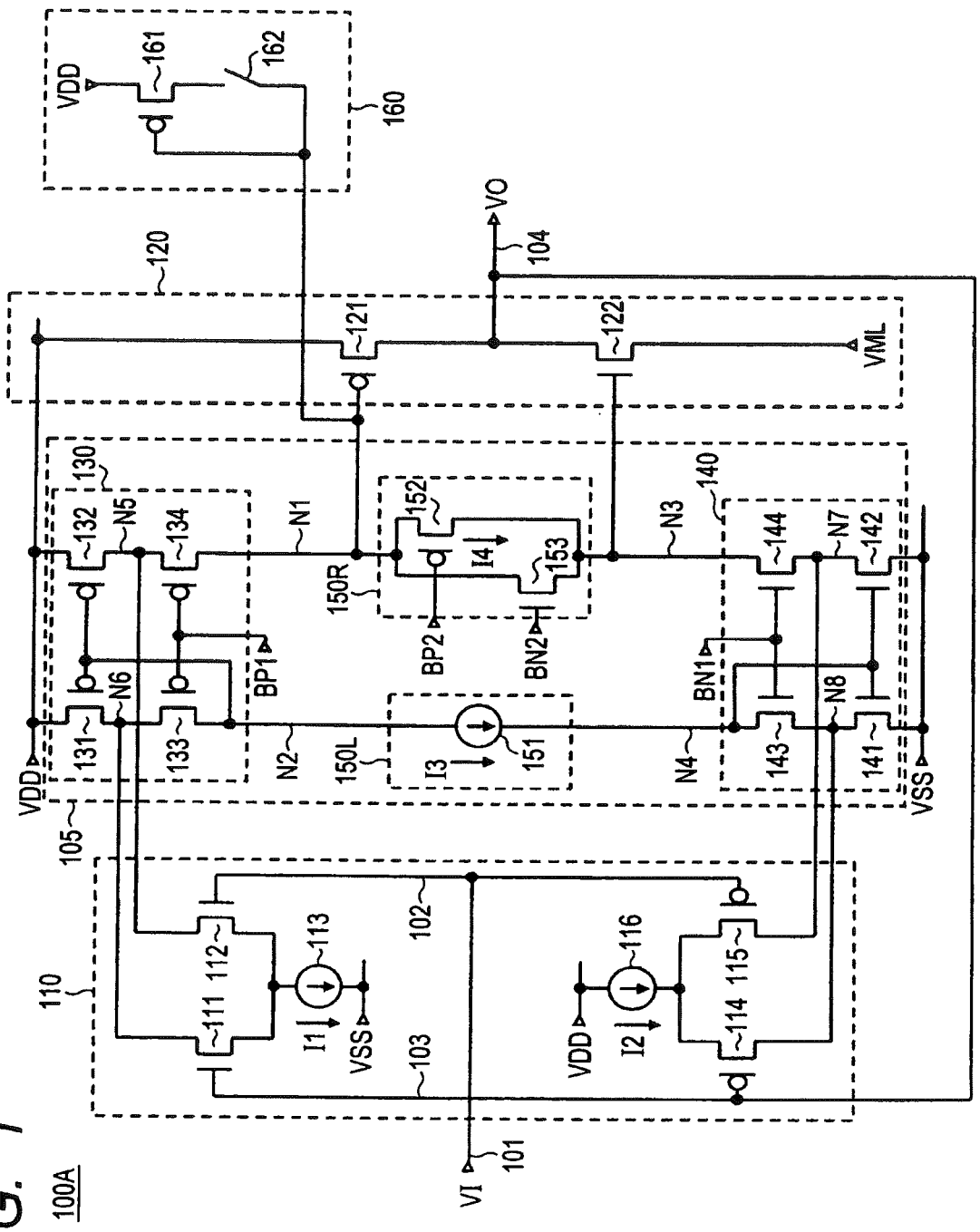
FIG. 1 is a diagram illustrating a configuration of a first embodiment of the present invention.

In one preferred embodiment of the present invention, an output circuit includes a differential amplifier circuit (110, 105), an output amplifier circuit (120), a first control circuit (160), an input terminal (101), an output terminal (104), and first to third supply terminals (VDD, VSS, VNL).

The differential amplifier circuit includes a differential input stage (110) having a differential input pair with a first input (102) and a second input (103) to which an input signal (VI) of the input terminal (101) and an output signal (VO) of the output terminal (104) are input, respectively; first and second current mirrors (130, 140) that are coupled to first and second power supplies (VDD, VSS), respectively; a first connection circuit (150L) that is coupled between respective inputs (between nodes N2 and N4) of the first and second current mirrors (130, 140); and a second connection circuit (150R) that is coupled between respective outputs (between nodes N1 and N3) of the first and second current mirrors (130, 140). At least one of the first and second current mirrors (130, 140) receives an output current of the differential input stage (110). The first and second current mirrors (130, 140), and the first and second connection circuits (150L, 150R) configure an intermediate stage (105) that couples the differential input stage (110) and the output amplifier circuit (120).

The output amplifier circuit (120) includes a first transistor (121) of a first conduction type which is coupled between the first supply terminal (VDD) and the output terminal (104), and has a control terminal coupled to a coupling point (node N1) between an output of the first current mirror (130) and an end of the second connection circuit (150R), and a second transistor (122) of a second conduction type which is coupled between the third supply terminal (intermediate supply voltage VML) and the output terminal (104), and has a control terminal coupled to the other end (node N3) of the second connection circuit (150R).

The first control circuit (160) includes a third transistor (161) of the first conduction type and a switch (162) which are coupled in series between the first supply terminal (VDD) and the control terminal (node N1) of the first transistor (121), and a control terminal (gate) of the third transistor (161) is coupled to a control terminal (node N1) of the first transistor (121). When the switch (162) is kept on for a given period every time the input signal (VI) that is input to the input terminal (101) is switched (for example, at a start time of the output period), the third transistor (161) is activated in a diode coupling mode between the first supply terminal (VDD) and the control terminal (node N1) of the first transistor (121). When the potentials of the control terminals (nodes N1 and N2) of the first and second transistors (121, 122) of the output amplifier circuit (120) fluctuates toward the second supply terminal (VSS) side with respect to the potential in an output stable state, the potential is promptly returned to the vicinity of the potential in the output stable state. When the switch (162) turns off after the given period, a current path of the third transistor (161) between the first supply terminal (VDD) and the control terminal (node N1) of the first transistor (121) is cut off, and the third transistor (161) is deactivated. Then, the charging operation and the discharging operation of the output terminal (104) starts without any delay according to the voltage of the input signal (VI), and the voltage corresponding to the voltage of the input signal (VI) is output to the output terminal (104).

The third supply voltage (VML) is set to a potential between the first and second supply voltages (VDD, VSS), or the second supply voltage (VSS).

In this way, in one of the preferable modes of the present invention, there is provided the control circuit (160) including the third transistor (161) and the switch (162) which are coupled in series between the control terminal (node N1) of the first transistor (121) in the output amplifier circuit (120) and the first supply terminal (VDD). The switch (161) is so controlled as to temporarily turn on at the moment of switching the input signal of the output circuit. When the switch (161) turns on, the third transistor (161) is activated in the diode coupling mode where the first terminal (drain) and the control terminal (gate) are coupled to each other. Even when the control terminal (gate) of the first transistor (121) in the output amplifier circuit (120) fluctuates (is lowered) toward the second supply terminal (VSS) side with respect to the potential of the output stable state at the moment of switching the input signal of the output circuit, the control terminal (gate) of the first transistor (121) is promptly returned to the potential of the output stable state through the activated third transistor (161) of the diode coupling mode. In this situation, the voltage of the control terminal (gate) of the second transistor (122), which is lower than the potential of the output stable state, is also promptly returned to the potential of the output stable state. As a result, the delay of the output signal during the high speed drive (delay of the output signal occurring at the time of switching from the charging operation of the output terminal to the discharging operation in Japanese Unexamined Patent Publication No. 2009-244830) can be suppressed. Hereinafter, the embodiments will be described.

First Embodiment

FIG. 1 is a diagram illustrating a configuration of an output circuit according to a first embodiment of the present invention. Referring to FIG. 1, an output circuit 100A according to this embodiment includes a differential amplifier circuit (110, 105), an output amplifier circuit 120, a control circuit 160, an input terminal 101, an output terminal 104, and the respective supply terminals of first to third power supplies VDD, VSS, and VML. A voltage between the supply voltages VDD and VSS is applied to the VML supply terminal. The supply voltage satisfies VSS≤VML<VDD.

In this embodiment, the differential amplifier circuit includes a differential input stage (input differential stage) 110 and an intermediate stage 105.

The differential input stage 110 includes a constant current source 113 having one end coupled to a VSS supply terminal, an Nch differential pair with NMOS transistors 112 and 111 having common sources coupled to the other end of the constant current source 113, and respective gates coupled to the input terminal 101 and the output terminal 104, a constant current source 116 having one end coupled to a VDD supply terminal, and a Pch differential pair with PMOS transistors 115 and 114 having common sources coupled to the other end of the constant current source 116, and respective gates coupled to the input terminal 101 and the output terminal 104. The gate of the NMOS transistor 112 and the gate of the PMOS transistor 115 are commonly coupled to each other to form a first input (non-inverting input) 102 of a differential input pair in the differential input stage 110, and an input signal VI is input to the first input (non-inverting input) 102 from the input terminal 101. The gate of the NMOS transistor 111 and the gate of the PMOS transistor 114 are commonly coupled to each other to form a second input (inverting input) 103 of the differential input pair in the differential input stage 110, and an output signal VO is input to the second input (inverting input) 103 from the output terminal 104. An analog signal voltage is applied to the input terminal 101 from a digital to analog converter (DAC) not shown which is disposed upstream of the output circuit.

The intermediate stage 105 includes a first current mirror 130, a second current mirror 140, a first connection circuit 150L, and a second connection circuit 150R.

The first current mirror 130 includes PMOS transistors 131 and 132 having sources coupled to the VDD supply terminal, and gates commonly coupled to each other, and PMOS transistors 133 and 134 having respective sources coupled to the drains of the PMOS transistors 131 and 132 and gates commonly coupled to each other, to which a first basis voltage BP1 is applied. The drain of the PMOS transistor 133 is coupled to the common gates of the PMOS transistors 131 and 132.

The second current mirror 140 includes NMOS transistors 141 and 142 having sources coupled to VSS supply terminal and gates commonly coupled to each other, and NMOS transistors 143 and 144 having respective sources coupled to the drains of the NMOS transistors 141 and 142, and gates commonly coupled to each other, to which a second bias voltage BN1 is applied. The drain of the NMOS transistor 143 is coupled to the common gates of the NMOS transistors 141 and 142.

The drains of the NMOS transistors 111 and 112 functioning as outputs of the Nch differential pair are coupled to a coupling node N6 between the PMOS transistors 131 and 133, and a coupling node N5 of the PMOS transistors 132 and 134, respectively.

The drains of the PMOS transistors 114 and 115 functioning as outputs of the Pch differential pair are coupled to a coupling node N8 between the NMOS transistors 141 and 143, and a coupling node N7 of the NMOS transistors 142 and 144, respectively.

The first connection circuit 150L includes a current source 151 coupled between a drain node of the PMOS transistor 133, which forms an input node N2 of the first current mirror 130, and a drain node of the NMOS transistor 143, which forms an input node N4 of the second current mirror 140.

The second connection circuit 150R includes a PMOS transistor 152 and an NMOS transistor 153 having a source and a drain coupled to the drain node of the PMOS transistor 134 functioning as an output node N1 of the first current mirror 130, a drain and a source coupled to the drain node of the NMOS transistor 144 functioning as an output node N3 of the second current mirror 140, and respective gates to which third and fourth bias voltages BP2 and BN2 are applied, respectively. The first and second connection circuits 150L and 150R form a floating current source circuit.

The output amplifier circuit 120 includes a PMOS transistor 121 coupled between the VDD supply terminal and the output terminal 104, and having a gate coupled to the coupling node (node N1) between the output of the first current mirror 130 and one end of the second connection circuit 150R, and an NMOS transistor 122 coupled between the VML supply terminal and the output terminal 104, and having a gate coupled to the other end (node N3) of the second connection circuit 150R.

The control circuit 160 includes a PMOS transistor 161 having a source coupled to the VDD supply terminal, and a gate coupled to the gate (node N1) of the PMOS transistor 121, and a switch 162 coupled between the drain of the PMOS transistor 161 and the gate of the PMOS transistor 121.

When the switch 162 is on, the gate and drain of the PMOS transistor 121 are coupled to each other into a diode coupling mode. That is, when a voltage across the gate (node N1) of the PMOS transistor 121 is lower than a voltage VDD−|Vtp| (Vtp is a threshold voltage of the PMOS transistor 161), if the switch 162 turns on, the PMOS transistor 161 turns on, and the gate (node N1) of the PMOS transistor 121 in the output amplifier circuit 120 is pulled up to the supply voltage VDD side through the PMOS transistor 161 of the diode coupling. In this situation, the voltage (VDD−|Vtp|) is set to a value such that the output voltage VO of the output terminal 104 is close to a gate voltage of the PMOS transistor 121 in a stable state (a state where there is no voltage fluctuation). When the switch 162 turns on, the control circuit 160 conducts the operation (reset operation) of returning the gate voltage of the PMOS transistor 121 to the vicinity of the voltage in the state where the output is stable. When the switch 162 is off, a path of the control circuit 160 to the supply voltage VDD is cut off, and the gate (node N1) of the PMOS transistor 121 is not affected by the operation of the control circuit 160.

A supply voltage range of the output amplifier circuit 120 is set to [VDD to VML] with respect to the supply voltage range [VDD to VSS] of the differential amplifier circuit (110, 105).

Figure 14:
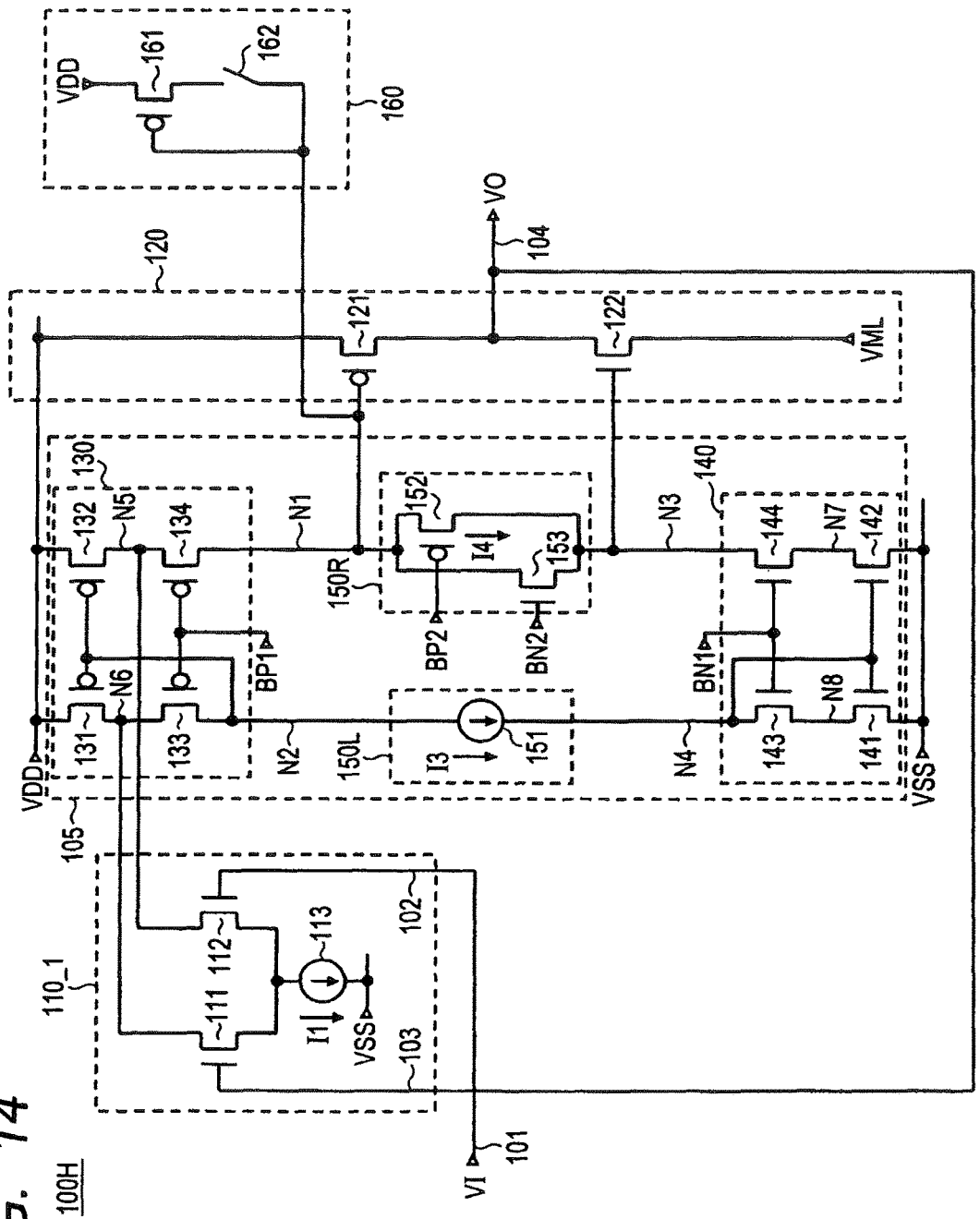
FIG. 14 is a diagram illustrating a configuration according to an eighth embodiment of the present invention.

In FIG. 1, the differential input stage 110 includes both of the Nch differential pair and the Pch differential pair. Alternatively, the differential input stage 110 may include a differential pair of only one conduction type (for example, only the Nch differential pair or only the Pch differential pair). The configuration of the differential pair having only one conduction type will be described as another embodiment (FIG. 14). Also, in FIG. 1, the first and second current mirrors 130 and 140 are each configured by a low-voltage cascade current mirror, but may be configured by a one-stage current mirror. The configuration of the one-stage current mirror will be described as still another embodiment (FIG. 15) later.

Figure 2:
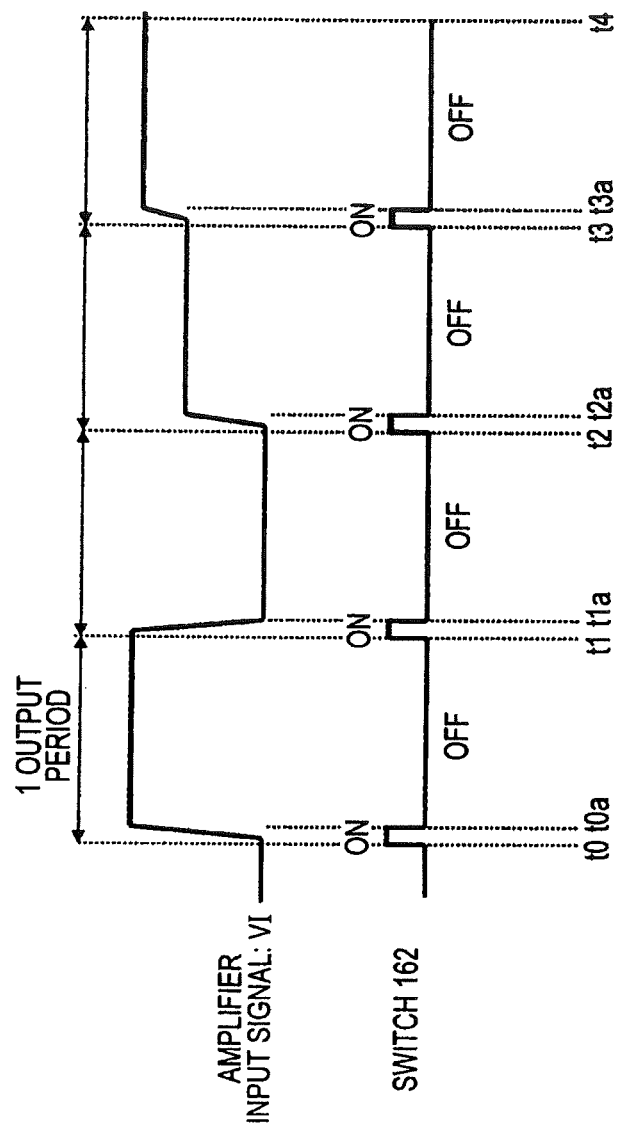
FIG. 2 is a timing chart illustrating a switch control according to the first embodiment of the present invention.

FIG. 2 is a diagram illustrating an example of switch control operation of FIG. 1. FIG. 2 illustrates input timings (t0, t1, t2, t3, t4) of four output periods of an input signal VI (step input waveform) input to the input terminal 101 in FIG. 1, and timings (from t0 to t0a, from t1 to t1a, from t2 to t2a, from t3 to t3a) when the switch 162 turns on. The switch 162 is kept on for a given period (from t0 to t0a) from a start time (for example, t0) of each output period of the input signal VI under the control.

A switch control signal for controlling the on/off operation of the switch 162 is supplied from a switch control signal generator circuit (807 in FIG. 16) not illustrated in FIG. 1 (the same is applied to other embodiments). The switch 162 may be configured by, for example, a PMOS transistor with a gate receiving the switch control signal. Also, for the purpose of preventing transition noise of a selection signal of a digital to analog converter (DAC) that outputs the input signal VI to the input terminal 101 in FIG. 1 from being input to the output circuit, an input switch is disposed between the output of the DAC and the input terminal 101. In this case, the given period during which the switch 162 of the control circuit 160 is kept on may be identical with a period during which the input switch is kept off at the time of switching the output period. Also, for the purpose of preventing the transition noise of the output signal VO of the output circuit from being transmitted to a data line load, an output switch is disposed between the output circuit and a data line load. In this case, the given period during which the switch 162 is kept on may be identical with a period during which the output switch is kept off at the time of switching the output period.

In the case where a heavy load (large-capacity load) such as the data lines of the display device is driven at a high speed (for example, column inversion drive), when VML=VDD/2 is set as one example, the input voltage VI of the output circuit in FIG. 1 switches from the vicinity of the high supply voltage VDD (for example, the charging operation of the output terminal 104 in the period t0 to t1 in FIG. 2) to the vicinity of the intermediate supply voltage VML (for example, the discharging operation of the output terminal 104 in the period t1 to t2 in FIG. 2). In this case, even if voltages across the gates (nodes N1, N3) of the transistors 121 and 122 in the output amplifier circuit 120 are remarkably decreased below the intermediate supply voltage VML at the time of switching the output period, the switch 162 is temporarily (period t1 to t1a in FIG. 2) turned on in the control circuit 160 immediately after switching the output period, and the PMOS transistor 161 is activated (turned on) in the diode coupling mode. For that reason, the gate (node N1) of the PMOS transistor 121 is instantly pulled up to a potential lower than the supply voltage VDD by the degree of the threshold voltage |Vtp| (absolute value) of the PMOS transistor 161, that is, the vicinity of the gate voltage in the output stable state (input voltage=output voltage).

Also, the gate (node N3) of the NMOS transistor 122 is pulled up to the vicinity of the gate voltage in the output stable state through the second connection circuit 150R forming the floating current source with the pulled-up voltage of the gate (node N1) of the PMOS transistor 121. That is, the control circuit 160 has an operation (reset operation) of returning the gate voltages of the transistors 121 and 122 in the output amplifier circuit 120 to voltages close to the respective gate voltages of the transistors 121 and 122 in the output stable state once.

Figure 19:
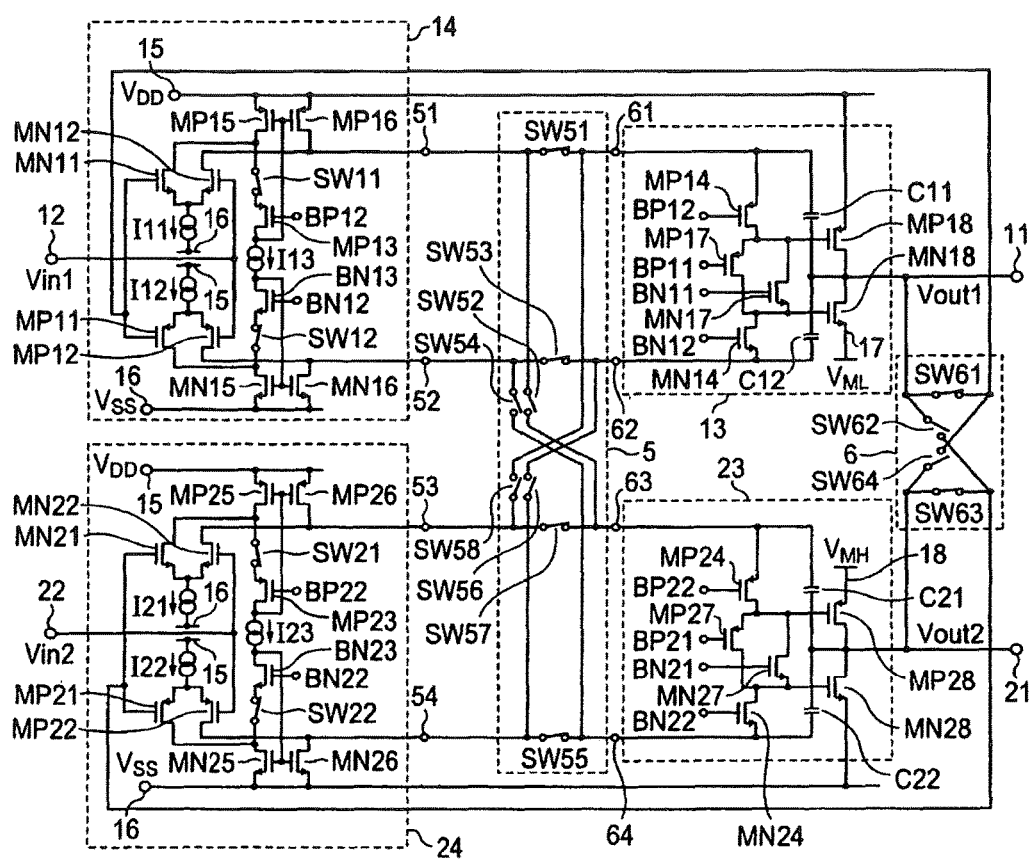
FIG. 19 is a diagram illustrating a configuration of the one related art.
Figure 20:
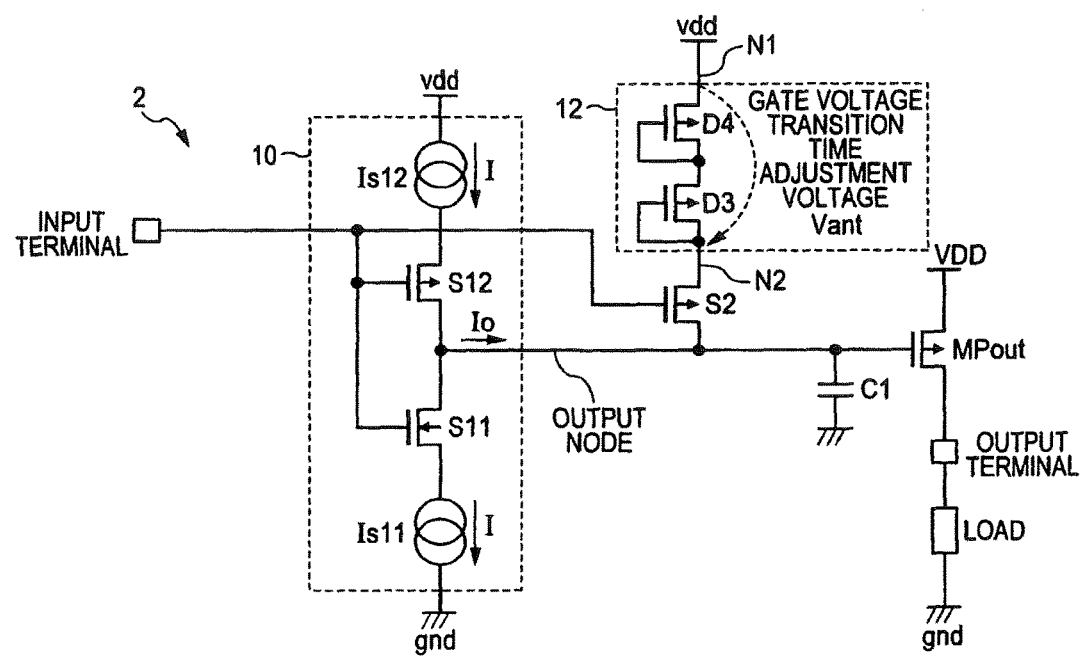
FIG. 20 is a diagram illustrating a configuration of another related art.

For that reason, as soon as the switch 162 in the control circuit 160 turns off, drive corresponding to the input voltage VI promptly starts, and there does not occur the delay of the output signal as shown in FIG. 21B illustrating the voltage waveform of the output signal in the related art of FIG. 19.

As described above, according to this embodiment, the gate voltages of the PMOS transistor 121 and the NMOS transistor 122 in the output amplifier circuit 120 fall below the intermediate supply voltage VML at the time of switching the output period (the input signal before switching is the vicinity of the high supply voltage VDD, and the input signal after switching is, for example, the vicinity of the intermediate supply voltage VML). Even in this case, the control circuit 160 is temporarily activated immediately after switching the output period, and the gate voltages of the PMOS transistor 121 and the NMOS transistor 122 are set to voltages close to the voltage in the output stable state. As a result, a falling waveform of the output signal in a subsequent output period starting from the switching time is prevented from being delayed.

Even if the potential of the input signal (VI) is not changed before and after switching the output period, the control circuit 160 may operate.

On the other hand, in the case where the configuration of the present invention is not applied, that is, the control circuit 160 is not provided, the input voltage VI of the output circuit in FIG. 1 switches from the vicinity of the high supply voltage VDD (period t0 to t1 in FIG. 2) to the vicinity of the intermediate supply voltage VML (period t1 to t2 in FIG. 2). In this case, if the voltages across the gates (nodes N1, N3) of the transistors 121 and 122 in the output amplifier circuit 120 are remarkably decreased below the intermediate supply voltage VML, the PMOS transistor 121 is on, and the NMOS transistor 122 is off. For that reason, in starting the discharging operation of the output terminal 104, it takes time for the voltages across the respective gates (nodes N1, N3) of the transistors 121 and 122 to rise up to the potentials in the output stable state once, and then rise up to the potentials allowing the PMOS transistor 121 to turn off, and the NMOS transistor 122 to turn on. Accordingly, a delay occurs in the rising of the output signal since the switching time (period t1 in FIG. 2) of the output period in which the input voltage VI switches from the vicinity of the high supply voltage VDD to the vicinity of the intermediate supply voltage VML till the discharging operation start time of the output terminal 104 due to the NMOS transistor 122. A time required to increase the voltages across the respective gates (nodes N1, N3) of the transistors 121 and 122 depends on an idling current value of the output circuit, and the delay time of the output signal is slightly reduced if the idling current value is made larger. However, the power consumption is remarkably increased.

Also, in the case where a heavy load such as the data lines in the display device is driven at a high speed, for example, when the intermediate supply voltage VML is set as the low supply voltage VSS, the input voltage VI of the output circuit in FIG. 1 switches from the vicinity of the high supply voltage VDD (period t0 to t1 in FIG. 2) to the vicinity of the supply voltage VML (=VSS) (period t1 to t2 in FIG. 2). In this case, voltages across the gates (nodes N1, N3) of the transistors 121 and 122 in the output amplifier circuit 120 may be remarkably decreased down to the vicinity of the low supply voltage VSS. In this situation, the PMOS transistor 121 is on, and the NMOS transistor 122 is off. When the control circuit 160 according to this embodiment is not provided, there is a case in which the voltages across the respective gates (nodes N1, N3) of the transistors 121 and 122 rise up to the potentials in the output stable state, and the falling of the output signal is delayed until the discharging operation of the output terminal 104 due to the NMOS transistor 122 starts. On the contrary, in this embodiment, the control circuit 160 is provided, and the control circuit 160 is temporarily activated (the switch 162 is rendered conductive, and the PMOS transistor 161 is activated) immediately after switching the output period, thereby instantly returning the respective gate voltages of the transistors 121 and 122 to the potentials in the output stable state (reset operation). As a result, the discharging operation to the output terminal 104 can be started without any delay.

In order to avoid the delay of the falling of the output signal at the time of switching the output period, it is most important to instantly return the respective gate voltages of the transistors 121 and 122 in the output amplifier circuit 120 to the potentials in the output stable state (reset operation) immediately after switching the output period. The control circuit 160 according to this embodiment realizes a circuit having the reset operation with a simple configuration.

As a comparative example (reference example), a description will be given of a configuration in which a switch is disposed between the gate (node N1) of the PMOS transistor 121 and the high supply terminal VDD instead of the control circuit 160. This comparative example (reference example) is a case in which in the control circuit 160 of FIG. 1, the PMOS transistor 161 is removed, and only the switch 162 is disposed between the node N1 and the high supply terminal VDD. When the switch between the node N1 and the high supply terminal VDD temporarily turns on immediately after switching the output period, the voltages across the gates (nodes N1, N3) of the transistors 121 and 122, which are remarkably decreased toward the low supply voltage VSS side is pulled up. However, in this situation, the gate (node N1) of the PMOS transistor 121 is pulled up to the high supply voltage VDD, and the gate (node N1) of the NMOS transistor 122 is also pulled up to the vicinity of the high supply voltage VDD through the second connection circuit 150R. This is because when the node N1 is pulled up to the supply voltage VDD, a voltage between the gate and the source of the PMOS transistor 152 in the second connection circuit 150R rises, and a current flowing between the nodes N1 and N3 increases. As a result, the voltages across the gates (nodes N1, N3) of the PMOS transistor 121 and the NMOS transistor 122 rise up to the vicinity of the high supply voltage VDD, and then a delay occurs in the rising of the output signal at the time of switching the output terminal 104 from the discharging operation to the charging operation.

With the above configuration, in the output circuit having the second connection circuit 150R functioning as the floating current source disposed between the gate (N1) of the PMOS transistor 121 and the gate (N3) of the NMOS transistor 122 in the output amplifier circuit 120, there is a need to instantly return the respective gate voltages of the PMOS transistor 121 and the NMOS transistor 122 in the output amplifier circuit 120 to the potentials in the output stable state (reset operation).

According to this embodiment, the switch 162 is kept on for a sufficiently short given period (t0 to t0a) immediately after starting the respective output periods, and the control circuit 160 supplies a current for returning the voltages of the gates (nodes N1, N3) of the transistors 121 and 122 in the output amplifier circuit 120 to the vicinity of the voltage in the output stable state in the given period (t0 to t0a). A current to be supplied by the control circuit 160 does not interfere with the operation of the output circuit 100A, but assists the output circuit 100A to switch from the charging operation of the load to the discharging operation with a change in the input signal VI. Therefore, the current value is as small as a current required to charge the gate capacities of the transistors 121 and 122, and there occurs no problem that the power consumption is increased.

Figure 18:
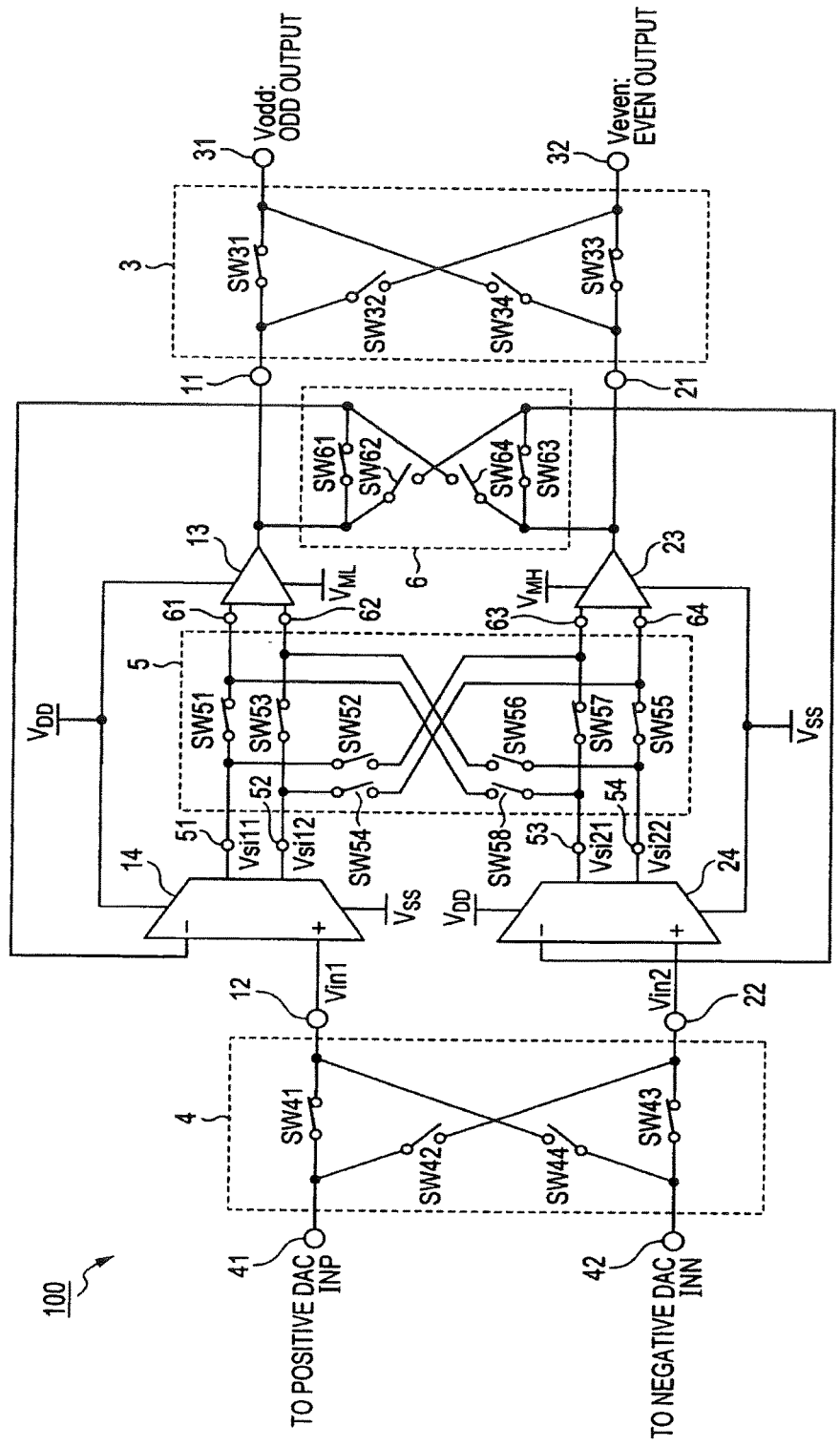
FIG. 18 is a diagram illustrating a configuration of one related art.

The configuration of this embodiment can be applied to the output circuit (the differential stage 14 or 24, and the positive dedicated output stage 13 which receive the positive DAC signal) that conducts the positive voltage output operation in FIGS. 18 and 19. Also, the configuration can be applied to the output circuit that conducts the gradation voltage output operation under the condition of VNL=VSS.

According to this embodiment, with the provision of the control circuit 160, the delay of the output signal at the time of switching the output period from the charging operation to the discharging operation of the output terminal 104 can be avoided. In the above embodiment, the most remarkable example is described in which the input signal changes in the vicinity of the supply voltage VDD or VML. However, it is needless to say that the present invention is not limited to this example. The same is applied to the following embodiments.

Second Embodiment

Figure 3:
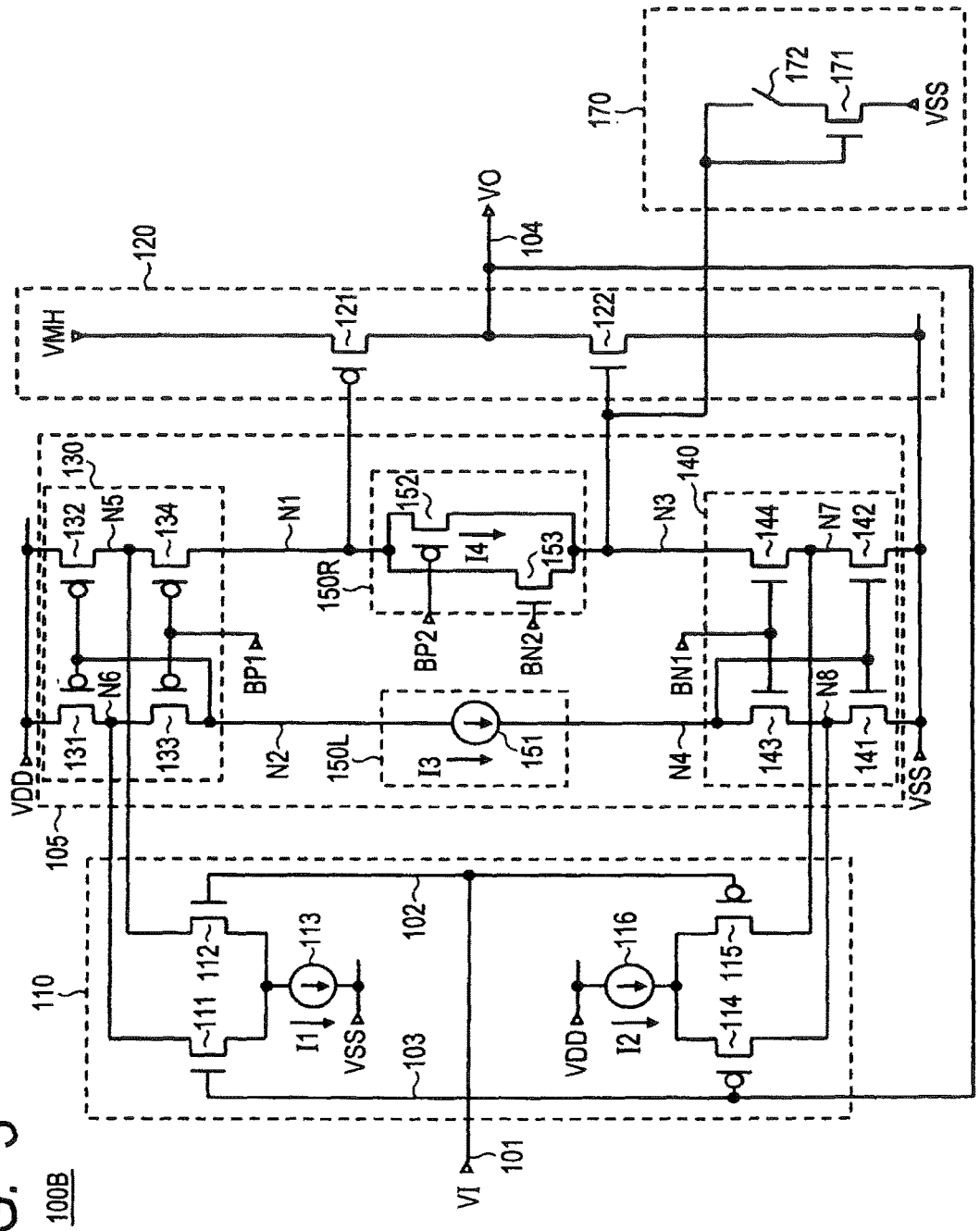
FIG. 3 is a diagram illustrating a configuration according to a second embodiment of the present invention.

Subsequently, a second embodiment of the present invention will be described. FIG. 3 is a diagram illustrating a configuration according to a second embodiment of the present invention. Referring to FIG. 3, in an output circuit 100B according to this embodiment, the differential input stage 110, the first and second current mirror 130 and 140, and the first and second connection circuits 150L and 150R are identical with those in the above first embodiment (FIG. 1). The output amplifier circuit 120 includes the PMOS transistor 121 having a source coupled to the VMH supply terminal to which the intermediate supply voltage VMH is applied, a gate coupled to one end of the second connection circuit 150R, and a drain coupled to the output terminal 104, and the NMOS transistor 122 having a source coupled to the VSS supply terminal, a gate coupled to the other end of the second connection circuit 150R, and a drain coupled to the output terminal 104. In this example, VSS<VMH≤VDD is satisfied.

The output circuit 100B according to this embodiment includes a control circuit 170 instead of the control circuit 160 of the first embodiment. That is, in the first embodiment, the control circuit 160 is configured by the switch 162 and the PMOS transistor 161. On the other hand, in this embodiment, the control circuit 170 includes an NMOS transistor 171 having a source coupled to the VSS supply terminal and a gate coupled to the gate (node N3) of the NMOS transistor 122, and a switch 172 coupled between the drain of the NMOS transistor 171 and the gate of the NMOS transistor 122. When the switch 172 is on, the gate of the NMOS transistor 122 is coupled to the gate and drain of the NMOS transistor 171, and activated as a diode coupling. That is, when the gate voltage of the NMOS transistor 122 is higher than a voltage VSS+Vth (Vtn is a threshold voltage of the NMOS transistor 171), if the switch 172 turns on, the NMOS transistor 171 turns on, and the gate voltage of the NMOS transistor 122 is pulled down to the supply voltage VSS side. In this situation, the voltage (VSS+Vtn) is set to a value such that the output voltage VO of the output terminal 104 is close to the gate voltage of the NMOS transistor 122 in a stable state. When the switch 172 turns on, the control circuit 170 conducts the operation (reset operation) of returning the gate voltage of the NMOS transistor 122 to the vicinity of the voltage in the output stable state. When the switch 172 is off, a path of the control circuit 170 to the supply voltage VSS is cut off, and the gate node N3 of the NMOS transistor 122 is not affected by the operation of the control circuit 170. As with the switch 162 in FIG. 2, the switch 172 is kept on for a sufficiently short given period (t0 to t0a, t1 to t1a . . . in FIG. 2) immediately after start of each output period, and kept off for a subsequent period (t0a to t1, t1a to t2, t2a to t3 . . . ) within one output period.

In the case where a heavy load such as the data lines of the display device is driven at a high speed (column inversion drive), for example, when VMH=VDD/2 is set, the input voltage VI of the output circuit in FIG. 3 switches from the vicinity of the low supply voltage VSS (the discharging operation of the output terminal 104) to the vicinity of the intermediate supply voltage VMH (the charging operation of the output terminal 104). In this case, even if voltages across the gates (nodes N1, N3) of the transistors 121 and 122 in the output amplifier circuit 120 are remarkably increased above the intermediate supply voltage VMH at the time of switching the output period, the switch 172 is temporarily turned on in the control circuit 170 immediately after switching the output period, and the NMOS transistor 171 is activated (turned on) in the diode coupling mode. For that reason, the gate node N3 of the NMOS transistor 122 is instantly pulled down to a potential higher than the supply voltage VSS by the degree of the threshold voltage |Vtn| of the NMOS transistor 171, that is, the vicinity of the gate voltage of the NMOS transistor 122 in the output stable state.

Also, the gate node N1 of the PMOS transistor 121 is pulled down to the vicinity of the gate voltage in the output stable state through the second connection circuit 150R forming the floating current source with the pulled-down voltage of the gate node N3 of the NMOS transistor 122. That is, the control circuit 170 has an operation (reset operation) of returning the gate voltages of the transistors 121 and 122 in the output amplifier circuit 120 to voltages close to the respective gate voltages of the transistors 121 and 122 in the output stable state. For that reason, as soon as the switch 172 in the control circuit 170 turns off, drive corresponding to the input voltage VI promptly starts, and there does not occur the delay of the output signal.

As described above, according to this embodiment, the gate voltage of the NMOS transistor 122 in the output amplifier circuit 120 rises above the VMH at the time of switching the output period. Even in this case, the control circuit 170 is temporarily activated immediately after switching the output period, with the result that the output signal in the subsequent output period is prevented from being delayed. Even if the voltage of the input signal (VI) is not changed before and after the output period, the control circuit 170 may operate.

On the other hand, in the case where the configuration of the present invention is not applied, that is, the control circuit 170 is not provided, the input signal voltage VI of the output circuit in FIG. 3 switches from the vicinity of the low supply voltage VSS to the vicinity of the intermediate supply voltage VMH. In this case, if the voltages across the gates (nodes N1, N3) of the transistors 121 and 122 in the output amplifier circuit 120 are remarkably increased above the intermediate supply voltage VMH, the PMOS transistor 121 is off, and the NMOS transistor 122 is on. For that reason, in starting the charging operation to the output terminal 104, it takes time for the voltages across the respective gates (nodes N1, N3) of the transistors 121 and 122 to fall down to the potentials in the output stable state once, and then fall down to the potentials allowing the PMOS transistor 121 to turn on, and the NMOS transistor 122 to turn off. Accordingly, a delay occurs in the rising of the output signal since the switching time of the output period in which the input voltage VI switches from the vicinity of the low supply voltage VSS to the vicinity of the intermediate supply voltage VMH till the charging operation start time to the output terminal 104 due to the PMOS transistor 121. A time required to decrease the voltages across the respective gates (nodes N1, N3) of the transistors 121 and 122 depends on an idling current value of the output circuit, and the output delay time is slightly reduced if the idling current value is made larger. However, the power consumption is remarkably increased.

Also, in the case where a heavy load such as the data lines in the display device is driven at a high speed, for example, when VMH=VDD is set, the input voltage VI of the output circuit in FIG. 3 switches from the vicinity of the low supply voltage VSS to the vicinity of the supply voltage VMH (=VDD). In this case, voltages across the gates (nodes N1, N3) of the transistors 121 and 122 in the output amplifier circuit 120 may be remarkably increased up to the vicinity of the high supply voltage VDD. In this situation, the PMOS transistor 121 is off, and the NMOS transistor 122 is on.

When the control circuit 170 in FIG. 3 is not provided, there is a case in which the rising of the output signal is delayed until the voltages across the respective gates (nodes N1, N3) of the transistors 121 and 122 fall down to the potentials in the output stable state from the vicinity of the high supply voltage VDD, and the charging operation of the output terminal 104 due to the turned-on PMOS transistor 121 starts. On the contrary, according to this embodiment, with the provision of the control circuit 170, and the control circuit 170 is temporarily activated immediately after switching the output period, thereby instantly returning the respective gate voltages of the transistors 121 and 122 to the potentials in the output stable state (reset operation). As a result, the charging operation of the output terminal 104 can be started without any delay.

This embodiment can be applied to the output circuit (the differential stage 14 or 24, and the negative dedicated output stage 23 which receive the negative DAC signal) that conducts the negative voltage output operation in FIGS. 18 and 19. Also, this embodiment can be applied to the output circuit that conducts the gradation voltage output operation under the condition of VMH=VDD.

With the configuration having the control circuit 170 in FIG. 3, the output delay at the time of switching the output period from the discharging operation to the charging operation of the output terminal 104 can be avoided.

Third Embodiment

Figure 4:
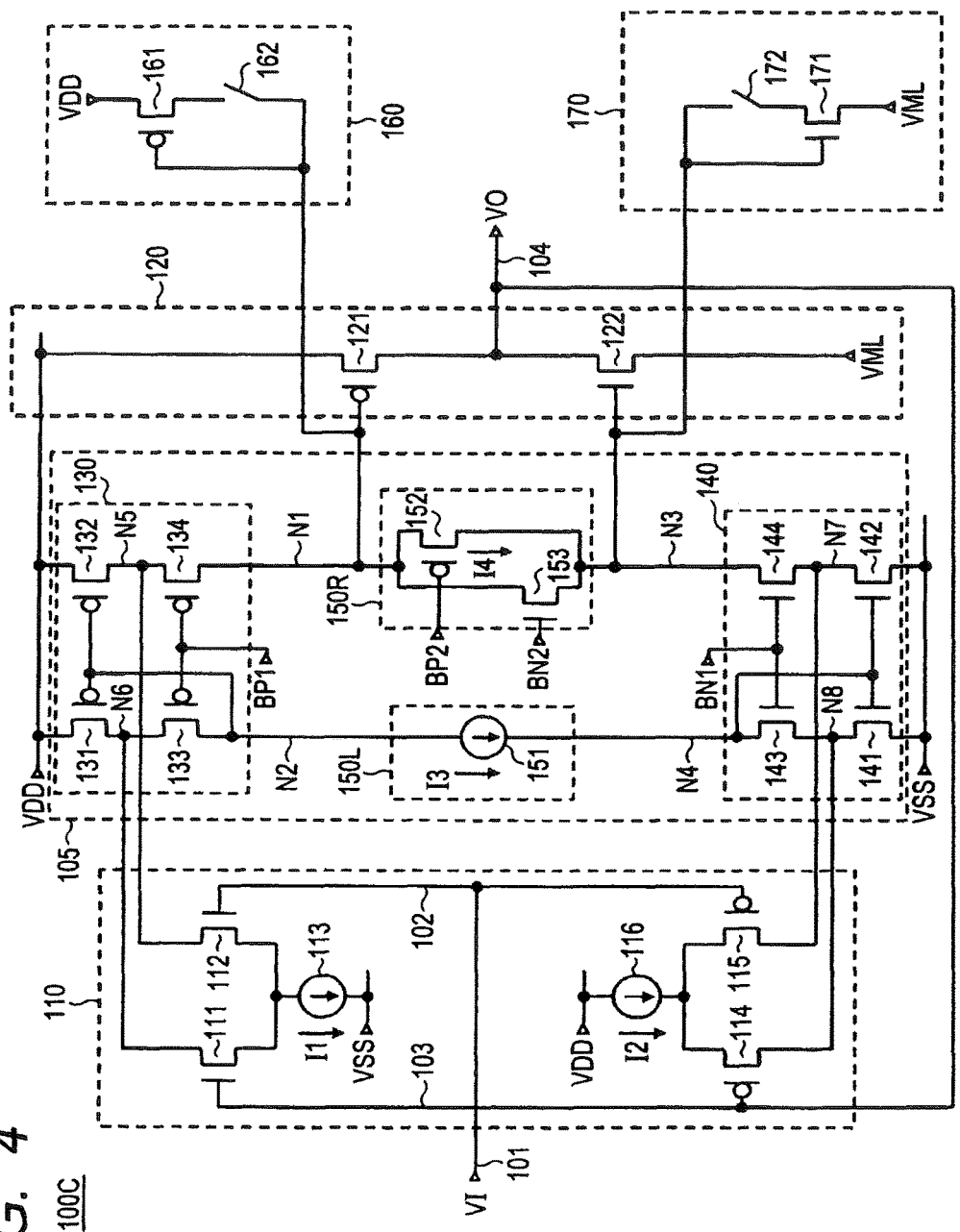
FIG. 4 is a diagram illustrating a configuration according to a third embodiment of the present invention.

Subsequently, a third embodiment of the present invention will be described. FIG. 4 is a diagram illustrating a configuration according to a third embodiment of the present invention. Referring to FIG. 4, in an output circuit 1000 according to this embodiment, the differential input stage 110, the first and second current mirror 130 and 140, and the first and second connection circuits 150L and 150R are identical with those in the above first embodiment. As in the first embodiment, the output amplifier circuit 120 includes the PMOS transistor 121 having a source coupled to the VDD supply terminal, a gate coupled to one end of the second connection circuit 150S, and a drain coupled to the output terminal 104, and the NMOS transistor 122 having a source coupled to the VML supply terminal, a gate coupled to the other end of the second connection circuit 150R, and a drain coupled to the output terminal 104. The supply terminal voltage is VSS<VML≤VDD.

The output circuit 100C according to this embodiment includes the control circuit 160 coupled between the VDD supply terminal and the gate of the PMOS transistor 121, and the control circuit 170 coupled between the VML supply terminal and the gate of the NMOS transistor 122. The circuit configuration of the control circuit 160 is identical with that of the control circuit 160 illustrated in FIG. 1.

The delay preventing operation of the output signal at the time of switching the output terminal 104 from the charging operation to the discharging operation due to the control circuit 160 is identical with that in the first embodiment, and therefore, its description will be omitted.

The control circuit 170 is identical in the configuration with the control circuit 170 illustrated in FIG. 3, and includes the NMOS transistor 171 and the switch 172. However, the control circuit 170 in FIG. 4 is different from the control circuit 170 illustrated in FIG. 3 in that the source of the NMOS transistor 171 is coupled to not the VSS supply terminal but the VML supply terminal. A threshold voltage Vth of the NMOS transistor 171 in the control circuit 170 is set to a value such that the voltage (VML+Vtn) is close to the gate voltage of the NMOS transistor 122 in the output amplifier circuit 120 in the output stable state.

The operation of the control circuit 170 will be described. In the case where a heavy load such as the data lines of the display device is driven at a high speed (for example, column inversion drive), for example, when VML=VDD/2 is set, the input voltage VI of the output circuit in FIG. 4 switches from the vicinity of the intermediate supply voltage VML (the discharging operation of the output terminal 104) to the vicinity of the high supply voltage VDD (the charging operation of the output terminal 104). In this case, there is a possibility that the voltages across the gates (nodes N1, N3) of the transistors 121 and 122 in the output amplifier circuit 120 rise to the vicinity of the high supply voltage VDD at the time of switching the output period. In this situation, because the PMOS transistor 121 is off, and the NMOS transistor 122 is on, when the control circuit 170 is not provided, there is a case in which a delay occurs in the rising of the output signal until the voltages of the respective gates (nodes N1, N3) of the transistors 121 and 122 fall to the potentials in the output stable state, and the PMOS transistor 121 turns on, and the charging operation of the output terminal 104 starts.

According to this embodiment, the control circuit 170 is provided, and even if the voltages across the gates (nodes N1, N3) of the transistors 121 and 122 in the output amplifier circuit 120 rise to the vicinity of the high supply voltage VDD at the time of switching the output period, the switch 172 is temporarily turned on in the control circuit 170 immediately after switching the output period, and the NMOS transistor 171 is activated (turned on) in the diode coupling mode. For that reason, the gate node N3 of the NMOS transistor 122 is instantly pulled down to a potential higher than the supply voltage VML by the degree of the threshold voltage Vtn of the NMOS transistor 171, that is, the vicinity of the gate voltage of the NMOS transistor 122 in the output stable state.

Also, the gate node N1 of the PMOS transistor 121 is pulled down to the vicinity of the gate voltage in the output stable state through the second connection circuit 150R forming the floating current source with the pulled-down voltage of the gate node N3 of the NMOS transistor 122. That is, the control circuit 170 has an operation (reset operation) of returning the gate voltages of the transistors 121 and 122 in the output amplifier circuit 120 to voltages close to the respective gate voltages of the transistors 121 and 122 in the output stable state. For that reason, as soon as the switch 172 in the control circuit 170 turns off, drive corresponding to the input voltage VI promptly starts, and there does not occur the delay of the output signal. As described above, according to this embodiment, even if the gate voltage of the NMOS transistor 122 in the output amplifier circuit 120 rises to the vicinity of the VDD immediately before switching the output period, the control circuit 170 is temporarily activated immediately after switching the output period, with the result that the rising of the output signal in the subsequent output period is prevented from being delayed.

In the case where a heavy load such as the data lines of the display device is driven at a high speed, for example, when VML=VSS is set, like the second embodiment (a case where VMH=VDD is set), the delay of the output signal at the time of switching the output period from the discharging operation to the charging operation is avoided.

Fourth Embodiment

Figure 5:
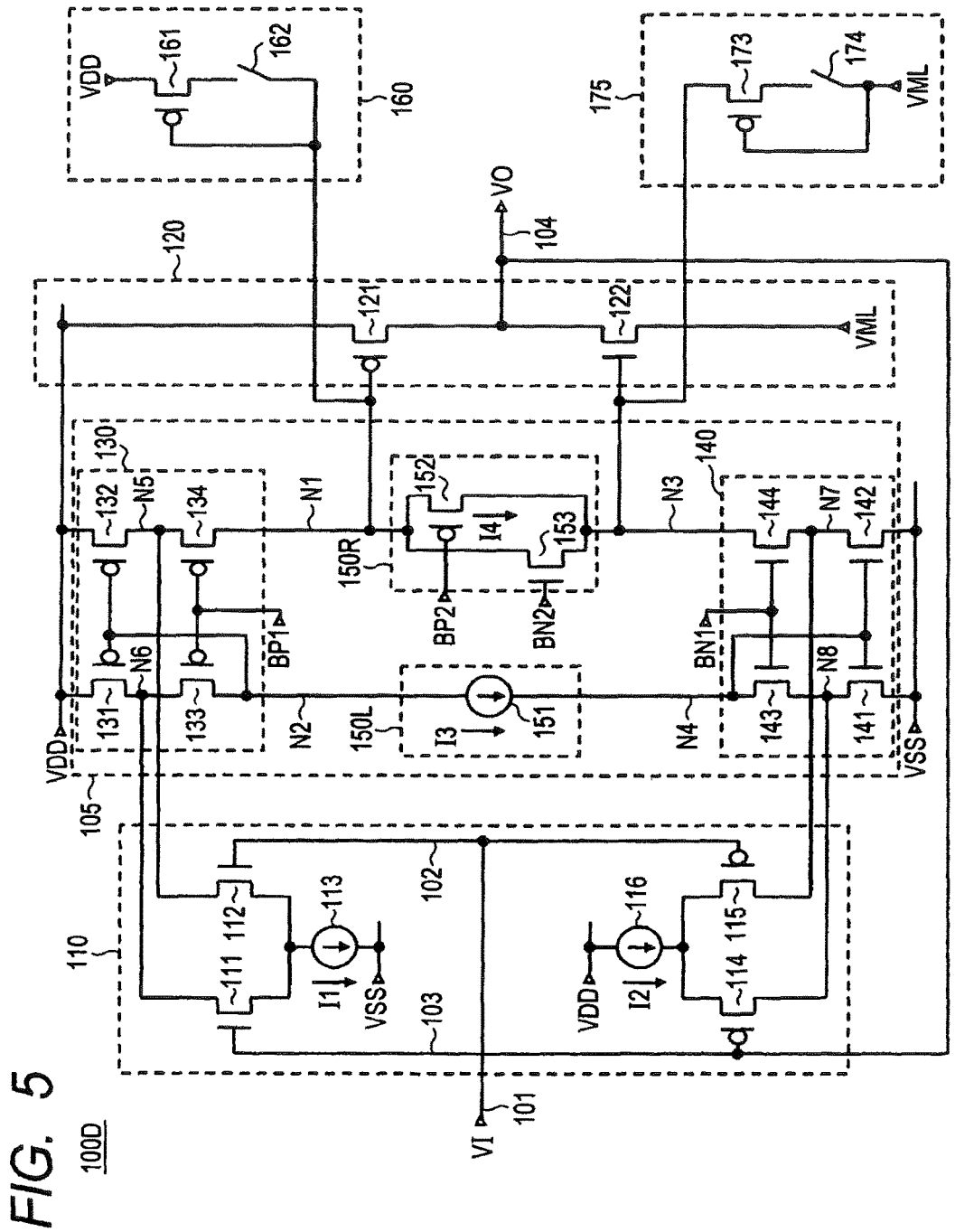
FIG. 5 is a diagram illustrating a configuration according to a fourth embodiment of the present invention.

Subsequently, a fourth embodiment of the present invention will be described. FIG. 5 is a diagram illustrating a configuration according to a fourth embodiment of the present invention. Referring to FIG. 5, in an output circuit 100D according to this embodiment, the control circuit 170 in the output circuit 100C according to the third embodiment in FIG. 4 is replaced with a control circuit 175. In this example, the supply terminal voltage is VSS≤VML<VDD.

The control circuit 160 is identical with the control circuit 160 of the output circuit 100C according to the third embodiment in FIG. 4. The delay preventing operation of the output signal at the time of switching the output terminal 104 from the charging operation to the discharging operation due to the control circuit 160 is identical with that in the first embodiment, and therefore, its description will be omitted.

The control circuit 175 includes a PMOS transistor 173 having a source coupled to the gate of the NMOS transistor 122, and a gate coupled to the VML supply terminal, and a switch 174 coupled between the drain of the PMOS transistor 173 and the VML supply terminal. When the switch 174 is on, the PMOS transistor 173 is activated (turned on) in the diode coupling mode. A threshold voltage |Vtp| (absolute value) of the PMOS transistor 173 in the control circuit 175 is set to a value such that s voltage (VML+|Vtp|) is close to the gate voltage of the NMOS transistor 122 in the output amplifier circuit 120 in the output stable state.

In this embodiment, as with the control circuit 170 in the output circuit 100C according to the third embodiment, the rising of the output signal at the time of switching the output period from the discharging operation of the load to the charging operation is prevented from being delayed due to the reset operation on the gate node N3 of the NMOS transistor 122 by the control circuit 175. Also, as in the first and third embodiments, the falling of the output signal at the time of switching the output period from the charging operation of the load to the discharging operation is prevented from being delayed due to the reset operation on the gate node N1 of the PMOS transistor 121 by the control circuit 160.

Fifth Embodiment

Figure 6:
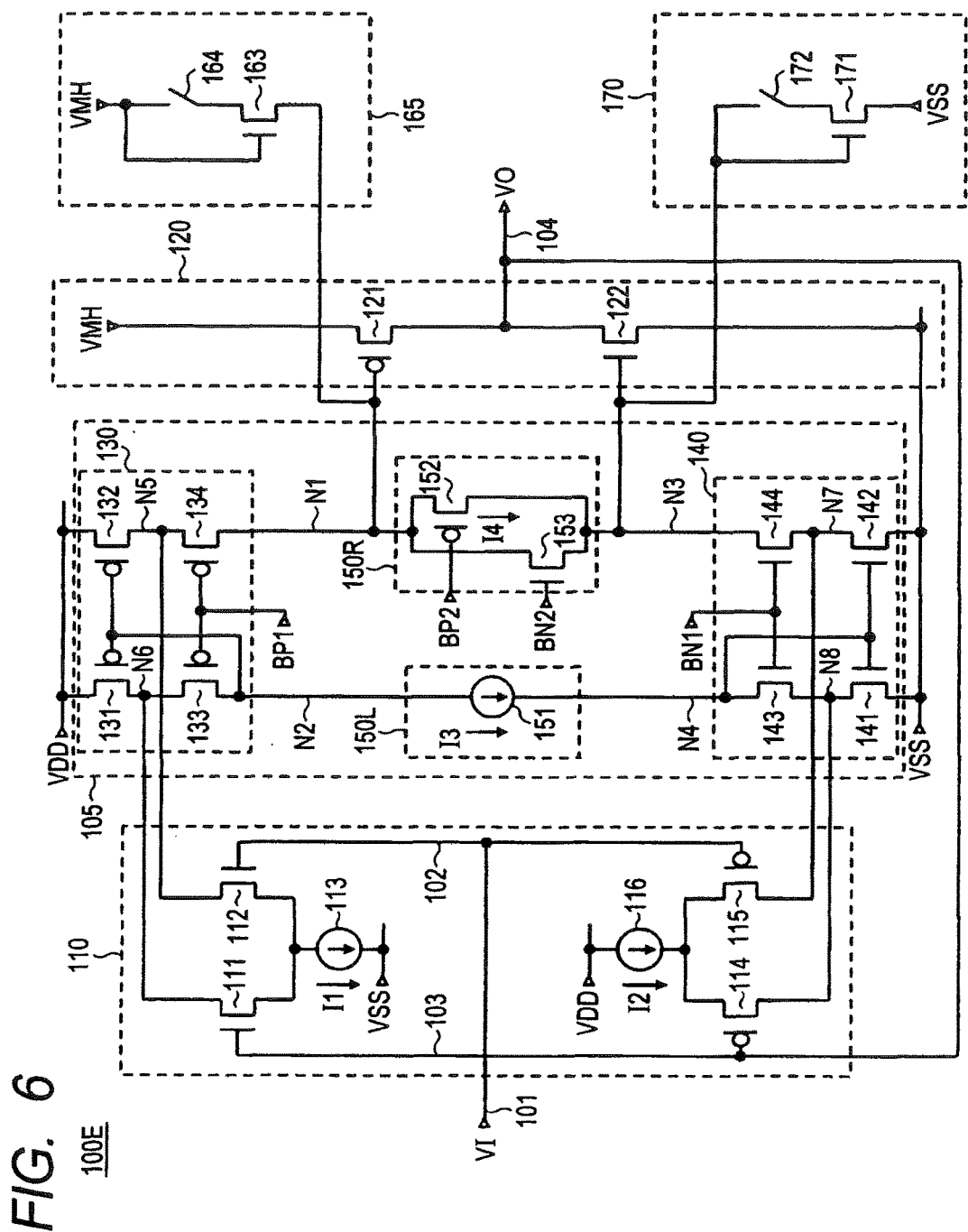
FIG. 6 is a diagram illustrating a configuration according to a fifth embodiment of the present invention.

Subsequently, a fifth embodiment of the present invention will be described. FIG. 6 is a diagram illustrating a configuration according to a fifth embodiment of the present invention. Referring to FIG. 6, in an output circuit 100E according to this embodiment, a control circuit 165 is further added to the output circuit 100B of the second embodiment in FIG. 3. In this example, the supply terminal voltage is VSS<VMH≤VDD.

The control circuit 170 is identical with the control circuit 170 according to the second embodiment in FIG. 3. The delay preventing operation of the output signal at the time of switching the output period of the output terminal 104 from the discharging operation to the charging operation due to the control circuit 170 is identical with that in the second embodiment, and therefore, its description will be omitted.

The control circuit 165 includes an NMOS transistor 163 having a source coupled to the gate node N1 of the PMOS transistor 121, and a gate coupled to the VMH supply terminal, and a switch 164 coupled between the drain of the NMOS transistor 163 and the VMH supply terminal. When the switch 164 is on, the NMOS transistor 163 is activated (turned on) in the diode coupling mode. Also, the threshold voltage Vtn of the NMOS transistor 163 in the control circuit 165 is set to a value such that the voltage (VMH-Vth) becomes close to the gate voltage of the PMOS transistor 121 in the output amplifier circuit 120 in the output stable state.

In this embodiment, as with the control circuit 170 according to the second embodiment, the output signal at the time of switching the output period of the output terminal 104 from the charging operation to the discharging operation is prevented from being delayed due to the reset operation on the gate node N3 of the NMOS transistor 122 by the control circuit 170.

The operation of the control circuit 165 will be described. In the high-speed drive (for example, column inversion drive) of a heavy load such as the data lines in the display device, for example, when VMH=VDD/2 is set, the input voltage VI of the output circuit in FIG. 6 switches from the vicinity of the intermediate supply voltage VML (the charging operation of the output terminal 104) to the vicinity of the low supply voltage VSS (the discharging operation of the output terminal 104). In this case, there is a possibility that the gate voltages across the transistors 121 and 122 fall to the vicinity of the low supply voltage VSS at the time of switching the output period. In this situation, because the PMOS transistor 121 is on, and the NMOS transistor 122 is off, when the control circuit 165 is not provided, there is a case in which a delay occurs in the falling of the output signal until the voltages of the respective gates (nodes N1, N3) of the transistors 121 and 122 rise to the potentials in the output stable state, and the NMOS transistor 122 turns on, and the discharging operation of the output terminal 104 starts.

On the contrary, according to this embodiment, with the provision of the control circuit 165, even if the voltages of the gates (nodes N1, N3) of the transistors 121 and 122 in the output amplifier circuit 120 fall to the vicinity of the lower supply voltage VSS at the time of switching the output period, the switch 164 is temporarily turned on in the control circuit 165 immediately after switching the output period, and the NMOS transistor 163 in the diode coupling state is activated (turned on). As result, the gate node N1 of the PMOS transistor 121 is instantly pulled up to the vicinity of the gate voltage of the PMOS transistor 121 in the output stable state.

Also, the gate node N3 of the NMOS transistor 122 in the output amplifier circuit 120 is pulled up to the vicinity of the gate voltage of the NMOS transistor 122 in the output stable state through the second connection circuit 50R forming the floating current source with the pulled-up voltage of the gate node N1 of the PMOS transistor 121.

That is, the control circuit 165 has an operation (reset operation) of returning the gate voltages of the transistors 121 and 122 in the output amplifier circuit 120 to voltages close to the respective gate voltages of the transistors 121 and 122 in the output stable state. For that reason, as soon as the switch 164 in the control circuit 165 turns off, drive corresponding to the input voltage VI promptly starts, and there does not occur the delay of the falling of the output signal.

Sixth Embodiment

Figure 7:
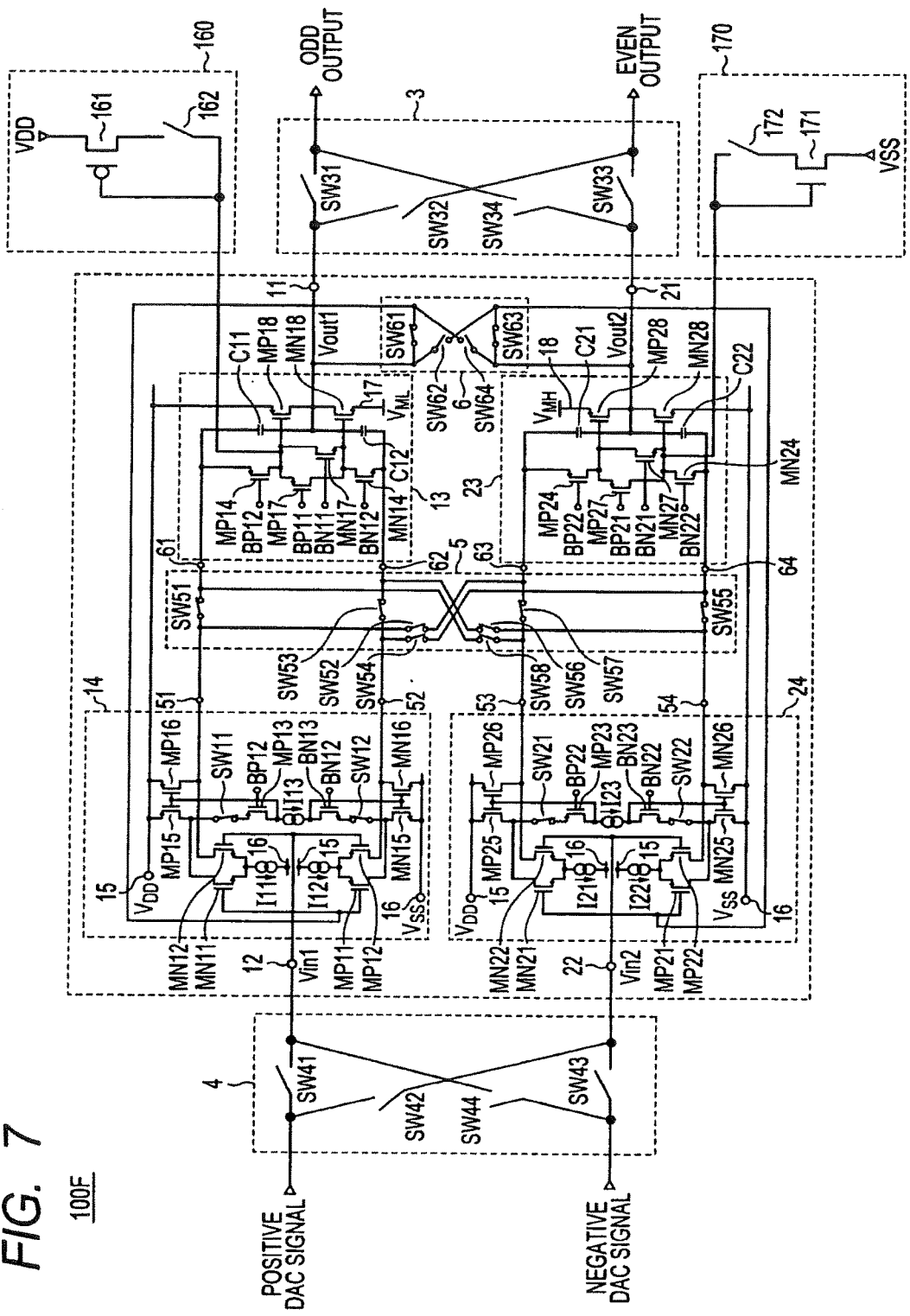
FIG. 7 is a diagram illustrating a configuration according to a sixth embodiment of the present invention.

Subsequently, a sixth embodiment of the present invention will be described. FIG. 7 is a diagram illustrating a configuration according to a sixth embodiment of the present invention. Referring to FIG. 7, this embodiment has a configuration (output circuit 100F) in which the control circuits 160 and 170 according to the first and second embodiments are applied to the positive dedicated output stage 13 and the negative dedicated output stage 23 in the related art illustrated in FIGS. 18 and 19, respectively. Since the configuration and operation of the related art illustrated in FIGS. 18 and 19 have been already described, hereinafter, their description will be omitted.

In the drive of the liquid crystal display device, the switch circuit 4 (SW41 to SW44) that conducts the input control of the positive DAC/negative DAC signal to the output circuit 100F is controlled so that the input of the positive DAC/negative DAC signal to the output circuit 100 is temporarily cut off for each output period for the purpose of preventing signal shorting from occurring between the positive DAC and the negative DAC signal, and also for the purpose of preventing the transition noise of the DAC selection signal from being input to the output circuit. The switches 162 and 172 of the control circuits 160 and 170 may be controlled to turn on during the input cutoff period of the switch circuit 4.

Also, in the drive of the liquid crystal display device, the switch circuit 3 (SW31 to SW34) conducts the output control for switching and outputting the positive output signal/negative output signal output from the output nodes (11, 21) of the positive dedicated output stage 13 and the negative dedicated output stage 23 in the output circuit to odd data lines and even data lines according to a polarity inverting signal. The switch circuit 3 is controlled to temporarily cut off the output from the output nodes (11, 21) to the data lines for each output period for the purpose of preventing signal shorting from occurring between the output nodes (11, 21) of the positive dedicated output stage 13 and the negative dedicated output stage 23, and also for the purpose of preventing the transition noise of the positive/negative output signals of the output circuit from being transmitted to the data lines. The switches 162 and 172 of the control circuits 160 and 170 may be controlled to turn on during the output cutoff period of the switch circuit 3.

The switches 162 and 172 may be turned on when all of the switches SW41 to SW44 are off in each output period.

Alternatively, the switch 162 may be on when both of the switches SW31 and SW32 are off in each output period, and the switch 172 may be on when both of the switches SW33 and SW34 are off in each output period.

According to this embodiment, there can be prevented the delay of the falling waveform of the positive output signal (signal at the terminal 11) in the positive dedicated output stage 13 from the VDD side to the VML side by the control circuit 160, and the delay of the rising waveform of the negative output signal (signal at the terminal 21) in the negative dedicated output stage 23 from the VSS side to the VNH side by the control circuit 170.

Seventh Embodiment

Figure 8:
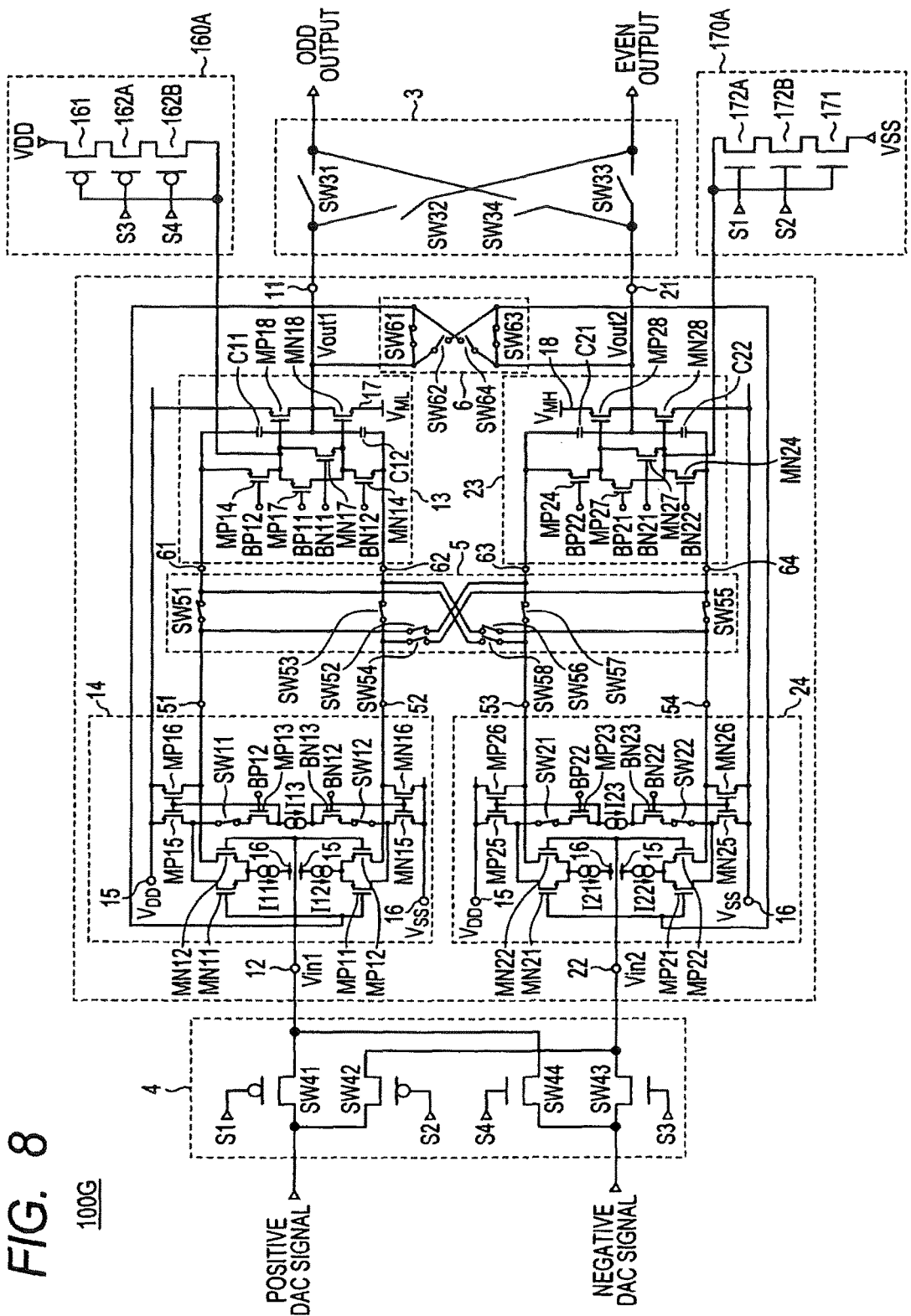
FIG. 8 is a diagram illustrating a configuration according to a seventh embodiment of the present invention.
Figure 9:
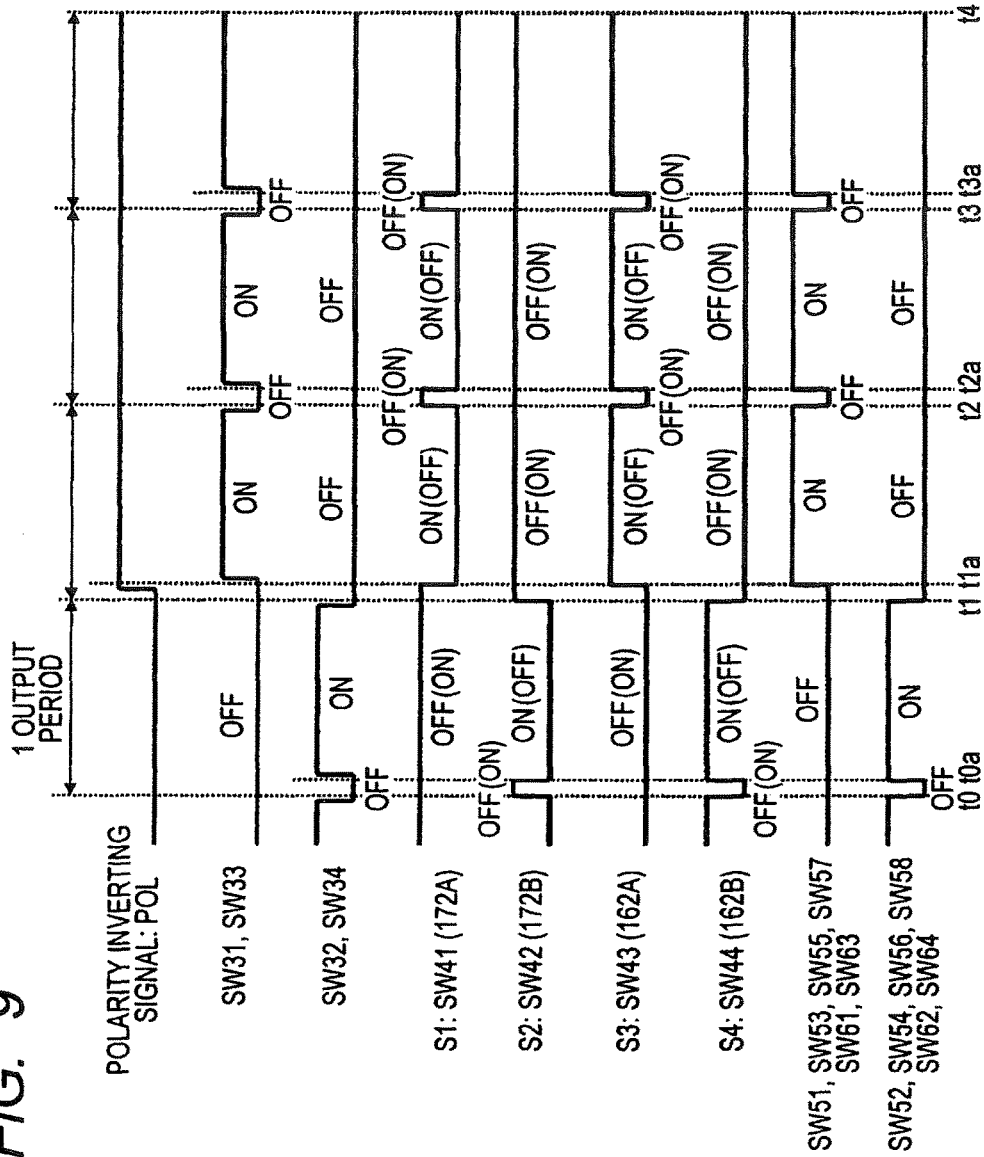
FIG. 9 is a timing chart illustrating a switch control according to a seventh embodiment of the present invention.

Subsequently, a seventh embodiment of the present invention will be described. FIG. 8 is a diagram illustrating a configuration according to a seventh embodiment of the present invention. This embodiment has a configuration (output circuit 100G) for conducting the on/off control of the switches 162 and 172 of the control circuits 160 and 170 in correspondence with the on/off control of the switch circuit 4 (SW41 to SW44). FIG. 9 is a timing chart illustrating the on/off control of each switch in the configuration of FIG. 8. FIG. 8 illustrates a configuration (160A, 170A) in which the control circuits 160 and 170 according to the first and second embodiments are applied to the positive dedicated output stage 13 and the negative dedicated output stage 23 in the related art of FIGS. 18 and 19, respectively.

When the switches 162 and 172 of the control circuits 160 and 170 are kept on in the input cutoff period immediately after start of each output period by the switch circuit 4 (SW41 to SW44) that controls the switching of input of the positive DAC signal and the negative DAC signal to the output circuit, if each of the switches 162 and 172 is configured by one switch transistor, the control signals S1 to S4 of the switch circuit 4 (SW41 to SW44) cannot be used as they are. Accordingly, there is a need to add a control signal for the switches 162 and 172.

The switches SW41 and SW42 that control an input of the positive DAC signal to the input terminal 12 of the differential stages 14 or to the input terminal 22 of the differential stages 24 can be configured by a CMOS configuration or a PMOS transistor. The on/off operation of switches SW41 and SW42 is controlled according to the control signals S1 and S2, respectively (the switches SW41 and SW42 are on when the control signals S1 and S2 are low). The switches SW43 and SW44 that control an input of the negative DAC signal to the input terminal 12 of the differential stages 14 or to the input terminal 22 of the differential stages 24 can be configured by a CMOS configuration or an NMOS transistor. The on/off operation of switches SW43 and SW44 is controlled according to the control signals S3 and S4, respectively (the switches SW43 and SW44 are on when the control signals S3 and S4 are high). FIG. 8 illustrates an example in which the switches SW41 and SW42 are each configured by a PMOS transistor, and the switches SW43 and SW44 are each configured by an NMOS transistor.

Also, when the polarity inverting signal POL is high, the switches SW41 and SW43 are off during the input cutoff period of each output period, and on during the subsequent period within one output period. When the polarity inverting signal POL is low, the switches SW41 and SW43 are off through one output period.

When the polarity inverting signal POL is low, the switches SW42 and SW44 are off during the input cutoff period of each output period, and on during the subsequent period within one output period. When the polarity inverting signal POL is high, the switches SW42 and SW44 are off through one output period.

For that reason, in this embodiment (FIG. 8), in the control circuit 160A, the switch 162 in the control circuit 160 of FIG. 7 is configured by PMOS transistors 162A and 162B coupled in series, and the switch 172 in the control circuit 170 of FIG. 7 is configured by NMOS transistors 172A and 172B coupled in series. Control signals S1 and S2 for controlling the on/off operation of the switches SW41 and SW42, respectively, are input to the gates of the NMOS transistors 172A and 172B, respectively. Control signals S3 and S4 for controlling the on/off operation of the switches SW43 and SW44, respectively, are input to the gates of the PMOS transistors 162A and 162B, respectively. The coupling order of the NMOS transistors 172A and 172B may be reversed. Likewise, the coupling order of the PMOS transistors 162A and 162B may be reversed.

With the above configuration, in the control circuits 160A and 170A, the controls signals S1 to S4 for controlling the on/off operation of the switch circuit 4 (SW41 to SW44) can be used as they are, and no additional control signal is required.

FIG. 9 illustrates an example in which the control signals of the switch circuit 5 (SW51 to SW58) and the switch circuit 6 (SW61 to SW64) share the control signals S1 to S4 of the switch circuit 4 (SW41 to SW44).

In the output period of driving the load except for the input cutoff period and the output cutoff period, a pattern 1 (coupling mode 1) in which the switches SW31, SW33, SW41, SW43, SW51, SW53, SW57, SW55, SW61, and SW63 are on, and the switches SW32, SW34, SW42, SW44, SW52, SW54, SW56, SW58, SW62, and SW64 are off, and a pattern 2 (coupling mode 2) in which the on/off states are reversed are switched in synchronism with the inversion of the polarity inverting signal (POL).

The pattern 2 is applied when the polarity inverting signal (POL) is low, and the pattern 1 is applied when the polarity inverting signal (POL) is high.

The switch transistors 162A, 162B, 172A, and 172B are reverse in the on/off state to the switches SW41, SW42, SW43, and SW44.

When the polarity inverting signal (POL) is low, in the input cutoff period (period t0 to t0a) immediately after start of one output period, the control signals S2 an S4 are high and low, respectively, the switches SW42 and SW44 are off, and the switches 172B and 162B are on. In the subsequent period (period t0a to t1) within one output period, because the control signals S2 and S4 are low and high, respectively, the switches SW42 and SW44 are on, and the switches 172B and 162B are off. On the other hand, the control signals S1 and S3 are high and low through one output period, respectively, the switches SW41 and SW43 are off, and the switches 172A and 162A are on.

When the polarity inverting signal (POL) is high, in the input cutoff period (periods t1 to t1a, t2 to t3, t3a to t4) immediately after start of one output period, the control signals S1 and S3 are high and low, respectively, the switches SW41 and SW43 are off, and the switches 172A and 162A are on. In the subsequent period (periods t1a to t2, t2a to t3, t3a to t4) within one output period, because the control signals S1 and S3 are low and high, respectively, the switches SW41 and SW43 are on, and the switches 172A and 162A are off. On the other hand, the control signals S2 and S4 are high and low through one output period, respectively, the switches SW42 and SW44 are off, and the switches 172B and 162B are on.

In the input cutoff period (period t0 to t0a) when the polarity inverting signal (POL) is low and high, both of the switches 172A and 172B are on according to the control signals S1 and S2, and both of the switches 162A and 162B are on according to the control signals S3 and S4.

With the above configuration, the PMOS transistor 161 of the control circuit 160 is activated (turned on) as the diode coupling mode, and the falling of the output signal at the time of switching the output period of the output terminal 11 of the positive dedicated output stage 13 from the charging operation to the discharging operation is prevented from being delayed. Also, the NMOS transistor 171 of the control circuit 170 is activated (turned on) as the diode coupling mode, and the rising of the output signal at the time of switching the output period of the output terminal 21 of the negative dedicated output stage 23 from the discharging operation to the charging operation is prevented from being delayed.

Referring to FIG. 9, the off period of the switch circuit 3 (SW31 to SW34) that switches the coupling between the output terminals 11, 21 of the output circuit 100G in FIG. 8 and the data lines (odd, even) is preferably set to include the off period of the switch circuit 4 (SW41 to SW44).

In the example of FIG. 9, when the polarity inverting signal POL is low, a period in which the switches SW32 and SW34 are off includes duration of the period in which the switches SW42 and SW44 are off (the pulse width of a high pulse and a low pulse of the controls signals S2 and S4). When the polarity inverting signal POL is high, a period in which the switches SW31 and SW33 are off includes duration of the period in which the switches SW41 and SW43 are off (the pulse width of a high pulse and a low pulse of the controls signals S1 and S3).

Also, in the case where an influence of the transition noise of the DAC selection signal is small, the switch circuit 3 (SW31 to SW34) in the column inversion drive can be controlled so as not to temporarily turn off every switching of one output period when a value of the polarity inverting signal POL is not changed. The same is applied to the switch circuit 5 (SW51 to SW58) and the switch circuit 6 (SW61 to SW64).

Simulation Results of First Embodiment

FIGS. 10A to 10D are diagrams illustrating the operation of the first embodiment illustrated in FIG. 1, which illustrate data line load near-end waveforms (circuit simulation results) of the output circuit that conducts the positive output operation of the column inversion drive. The simulations of FIGS. 10A to 10D are conducted under the same conditions as those of the simulations (FIG. 21) of the output circuit of the related art (Japanese Unexamined Patent Publication No. 2009-244830) illustrated in FIGS. 18 and 19. The differential amplifier circuit (110, 105) in FIG. 1 operates with the supply voltages VDD(16V) to VSS(0V), and a load is AC-driven in the vicinity of the supply voltage VDD (16V) and the vicinity of the supply voltage VML (8V) by the output amplifier circuit 120.

FIG. 10A illustrates the control signal for controlling the on/off operation of the switch 162 in FIG. 1 as with the control of the switch SW41 in FIG. 19. FIG. 10B is the output voltage of FIG. 1 corresponding to the output signal Vout1 in FIG. 19. FIG. 10C is a gate voltage waveform of the PMOS transistor 121 in the output amplifier circuit 120 of FIG. 1 corresponding to the PMOS transistor MP18 in the positive dedicated output stage 13 of FIG. 19. FIG. 10D is a gate voltage waveform of the NMOS transistor 122 in the output amplifier circuit 120 of FIG. 1 corresponding to the NMOS transistor MN18 in the negative dedicated output stage 23 of FIG. 19. FIGS. 10B, 10C, and 10D illustrate (a) the voltage waveforms when the load is AC-driven every one output period (2 μs), and (b) the voltage waveforms when the load is AC-driven every three output periods (6 μs) like FIGS. 21B to 21D.

In FIGS. 10C and 10D, when the load is AC-driven every one output period (2 μs) (waveforms (a)), the gate voltages of the transistors 121 and 122 in the output amplifier circuit 120 fall below the supply voltage VML (8 V) at the time of switching from the charging operation to the vicinity of the supply voltage VDD (16 V) to the discharging operation to the vicinity of the supply voltage VML (8 V) (times 7 μs, 11 μs, 15 μs in FIGS. 10C and 10D). However, the switch 162 temporarily turns on immediately after start of the output period, and the PMOS transistor 161 of the control circuit 160 is activated in the diode coupling mode with the result that the gate voltages of the transistors 121 and 122 in the output amplifier circuit 120 instantly return to the vicinity of the voltage in the output stable state.

In the waveform of the output voltage VO in FIG. 10B, particularly attention is paid to a time 7 μs when switching the output period from the charging operation to the discharging operation. Then, when the load is AC-driven every one output period (2 μs) (waveform (a)), no delay occurs in the falling waveform of the discharging operation after switching the output period like the case in which the load is AC-driven every three output periods (6 μs) (waveform (b)). As a result, it can be confirmed that the output signal delay is avoided in switching the output period of the output terminal from the charging operation to the discharging operation according to the first embodiment of FIG. 1. Similarly, in the respective embodiments of FIGS. 3 to 8 (including the output circuit that conducts the negative output operation with the supply voltage VMH (8V)), the effect of avoiding the output delay can be confirmed.

Simulation Results of Third Embodiment

FIGS. 11A to 11D are diagrams illustrating the operation of the third embodiment illustrated in FIG. 4. FIGS. 11A to 11D illustrate data line load near-end waveforms (circuit simulation results) of the output circuit of the dot inversion drive with the supply terminal voltage VML=VSS. FIGS. 11A to 11D also correspond to AC drive of the highest gradation and the lowest gradation in the drive of the organic light emitting diode display device. Also, although the drive conditions are not particularly limited, VDD is set to 16 V, VSS is set to 0V, and VML (=VSS) is set to 0V. The data line load is 200 pF (Pico farad) in capacity and 10 kΩ (kilo-ohm) in resistance. The one output period is set to 3.5 μs (microsecond) because the amplitude of the output signal is about twice of the column inversion drive (FIGS. 10A to 10D). In order to confirm the effects of the control circuits 160 and 170, there are shown the comparative results when there are the control circuits 160 and 170 in FIG. 4 (waveforms (d)), and when there are no control circuits 160 and 170 in FIG. 4 (waveforms (c)).

FIG. 11A illustrates the control signal for controlling the on/off operation of the switches 162 and 172 in FIG. 4, FIG. 11B is the output waveform of the output circuit in FIG. 4 (the output voltages VO (waveforms (d)/(c)) of the presence/absence of the control circuits 160 and 170 in FIG. 4), FIG. 11C is a gate voltage waveform of the PMOS transistor 121 in FIG. 4 (the gate voltage waveform (waveforms (d)/(c)) of the presence/absence of the control circuits 160 and 170 in FIG. 4), and FIG. 11D is a gate voltage waveform of the NMOS transistor 122 in FIG. 4 (the gate voltage waveform (waveforms (d)/(c)) of the presence/absence of the control circuits 160 and 170 in FIG. 4).

When the control circuits 160 and 170 in FIG. 4 are not provided, if the gate potentials of the PMOS transistor 121 and the NMOS transistor 122 in the output amplifier circuit 120 do not return to the potential in the output stable state within one output period in the dot inversion drive of a heavy load and a high drive frequency, a delay occurs in the output signal in the subsequent output period ((c) in FIG. 11B).

For example, in FIG. 11C, a time of switching the output period of the output terminal 104 from the charging operation to the discharging operation is set at a time 4.5 μs. At the switching time of the output period (time 4.5 μs), the gate voltage of the PMOS transistor 121 is in the vicinity of VSS, and does not return to the potential in the output stable state (waveform (c) in FIG. 11C), and therefore a delay occurs in the falling of the output voltage VO (waveform (c) in FIG. 11B).

Also, in FIG. 11D, a time of switching the output period of the output terminal 104 from the discharging operation to the charging operation is set at a time 8 μs. However, at the time of switching the output period (time 8 μs), the gate voltage of the NMOS transistor 122 does not return to the potential in the output stable state (waveform (c)). For that reason, a delay occurs in the rising of the output voltage VO (waveform (c)) in FIG. 11B. That is, even when the supply voltage ranges of the differential amplifier circuit (110, 105) and the output amplifier circuit (120) are identical with each other, it is confirmed that the output delay may occur in switching the output period in the drive of the heavy load and the high drive frequency.

On the other hand, in the third embodiment illustrated in FIG. 4, when the control circuits 160 and 170 are provided (waveforms (d) in FIGS. 11B, 11C and 11D), the switches 162 and 172 are temporarily turned on immediately after start of the output period every one output period (1H). The PMOS transistor 161 of the control circuit 160 and the NMOS transistor 171 of the control circuit 170 are activated whereby the gate voltages of the PMOS transistors 121 and 122 in the output amplifier circuit 120 instantly return to the vicinity of the voltage in the output stable state. For that reason, even if the output period is short, no delay occurs in the output signal. For example, at the time 4.5 μs of FIG. 11C, there is a time of switching the output period of the output terminal 104 from the charging operation to the discharging operation. However, because the gate voltage of the PMOS transistor 121 returns to the potential in the output stable state immediately after switching the output period (time 4.5 μs) (waveform (d)), no delay occurs in the falling of the output voltage VO (waveform (d)) of FIG. 11B. Also, at the time 8 μs in FIG. 11D, there is a time of switching the output period of the output terminal 104 from the discharging operation to the charging operation. However, because the gate voltage of the NMOS transistor 122 returns to the potential in the output stable state immediately after switching the output period (time 8 μs) (waveform (d)), no delay occurs in the rising of the output voltage VO (waveform (d)) in FIG. 11B.

Modified Example of Control Circuit

Figure 12A:
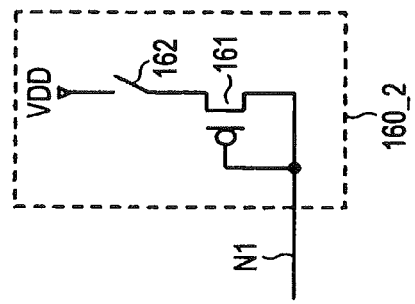
FIGS. 12A to 12C are diagrams illustrating examples of a control circuit.
Figure 12B:
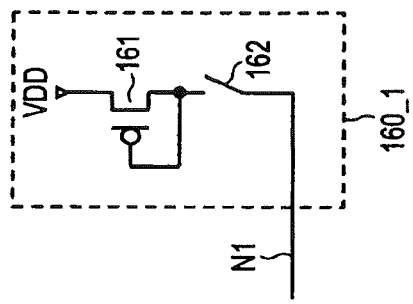
Figure 12C:
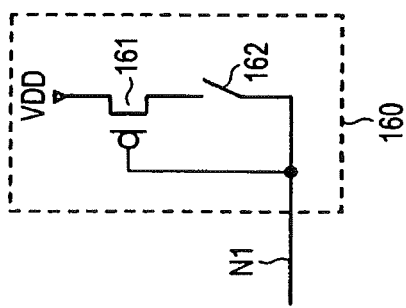

FIGS. 12A to 12C are diagrams illustrating configuration examples of the control circuit 160. FIG. 12A is the control circuit 160 in FIG. 1. The node N1 is a gate node of the PMOS transistor 121 in FIG. 1. When the switch 162 turns on, and the PMOS transistor 161 is diode-coupled, the node N1 of the low potential is pulled up to VDD−|Vtp| with a drain current (current drive performance) corresponding to a gate to source voltage Vgs=V(N1)−VDD. Vtp is a threshold voltage of the PMOS transistor 161. The switch 162 is configured by a transistor. It is desirable that the control circuit 160 pulls up the potential of the node N1 to VDD−|Vtp| at a time as short as possible after the switch 162 has turned on. In FIG. 12A, the source of the PMOS transistor 161 is coupled to the VDD supply terminal, the gate is coupled to the node N1, and the drain is coupled to the node N1 through the switch 162. A current for pulling up the potential of the node N1 depends on the gate to source voltage of the PMOS transistor 161. When a current flows in the switch (transistor) 162, a potential difference occurs between both ends of the switch due to an on resistance. However, in this configuration, an influence of the potential difference on the potential pull-up operation of the node N1 is small. For that reason, the node N1 can be pulled up to the potential VDD−|Vtp| at a high speed.

In a control circuit 160_1 in FIG. 12B, a drain (gate) of the diode-coupled PMOS transistor 161 is coupled to the node N1 through the switch 162. The switch 162 is configured by a transistor. The control circuit 160_1 can be replaced with the control circuit 160. However, when the switch 162 turns on, and a current flows in the switch 162 to generate a potential difference at both ends of the switch, the gate to source voltage (|Vgs|) of the PMOS transistor 161 is decreased, and the current drive performance is deteriorated as much. Therefore, a speed at which the node N1 is pulled up to the potential VDD−|Vtp| is slightly decreased as compared with the configuration of FIG. 12A. In order to avoid the delay of the speed at which the node N1 is pulled up to the potential VDD−|Vtp|, there is a need to increase the gate width W size of the PMOS transistor 161.

In FIG. 12C, the drain and gate of the diode-coupled PMOS transistor 161 are coupled to the node N1, and the source is coupled to the VDD supply terminal through the switch 162. The control circuit 160_2 can be replaced with the control circuit 160. As in FIG. 12B, when the switch 162 is turned on, and a current flows into the switch 162 to generate a potential difference at both ends of the switch, the gate to source voltage |Vgs| of the PMOS transistor 161 is decreased, and the current drive performance is deteriorated as much. As a result, a speed at which the node N1 is pulled up to the potential VDD−|Vtp| is slightly decreased. For that reason, there is a need to increase the gate width W size of the PMOS transistor 161.

From the above viewpoint, in the control circuit 160, the configuration of FIG. 12A is most preferable among FIGS. 12A to 12C. The NMOS transistor 171 and the switch 172 in the control circuit 170 according to the second embodiment can be also modified according to FIGS. 12B and 12C. The same is applied to the control circuits 165 and 175.

Another Modified Example of Control Circuit

Figure 13:
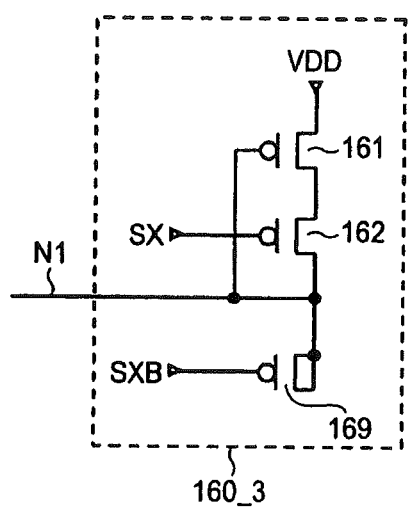
FIG. 13 is a diagram illustrating an example of the control circuit.

FIG. 13 is a diagram illustrating still another example of the control circuit 160 in FIG. 1. A control circuit 160_3 includes a PMOS transistor 169 (MOS capacitor: noise canceller transistor) having a gate receiving a complementary signal SXB of a control signal SX, and a drain and a source coupled to the node N1 in order to suppress the occurrence of noise in an output signal waveform (a signal waveform of the drain of the PMOS transistor 121) due to a fluctuation of the node N1 (a gate node of the PMOS transistor 121) caused by the capacitive coupling of a parasitic capacity between the drain and gate of the switch 162 (PMOS transistor 162) at the time of changing the control signal SX which is input to the gate of the PMOS switch 162 configuring the switch 162.

When the control signal SX is high, the switch (PMOS transistor) 162 turns off, and the control signal SXB becomes low. For example, in $|V_{GS}-V_T|>V_{DS}=0$ ($V_{GS}$ is a gate to source voltage, $V_T$ is a threshold value of the PMOS transistor 169, $V_{DS}$ is a drain to source voltage), the MOS capacitor (PMOS transistor 169) operates in an unsaturated region (triode region), and the capacity is regulated by a gate to channel capacity (a gate to source capacity Cgs and a gate to drain capacity Cgd which are coupled in parallel) and becomes Cgs+Cgd (Cgs+Cgd=εA/tox is satisfied from Cgs=Cgd=εA/(2×tox)). On the other hand, when the control signal SX is low, the switch 162 turns on, the control circuit 160_3 is activated, and the node N1 has a voltage obtained by subtracting |Vtp| (Vtp: threshold value of the PMOS transistor 161) from the supply voltage VDD. In this situation, because the control signal SXB is high, the PMOS transistor 169 turns off, no channel is formed (Cgs=Cgd=0), and the capacity is a gate to substrate capacity Cgb(=εA/tox).

With the coupling of the PMOS transistor 169 to the node N1, the noise of the node N1 caused by the capacitive coupling of the switch 162 is suppressed. In particular, the noise of the output waveform when the input signals of the output circuit before and after switching the output period are identical with each other can be suppressed. Similarly, the noise canceller element may be provided in the control circuits 165, 170, and 175.

Eighth Embodiment

Subsequently, an eighth embodiment of the present invention will be described. FIG. 14 is a diagram illustrating a configuration according to an eighth embodiment of the present invention. Referring to FIG. 14, in an output circuit 100H of this embodiment, the differential input stage 110 in the output circuit 100A of FIG. 1 is replaced with a differential input stage 110_1. The differential input stage 110_1 is configured by deleting the Pch differential pair (115, 114) and the constant current source 116 from the differential input stage 110 of FIG. 1. With this configuration, the input operating voltage of the differential input stage 110_1 is narrowed to a range of from the VSS supply terminal voltage to the threshold voltage Vtn of the NMOS transistors 111 and 112 of the Nch differential pair (112, 111), and becomes VSS+Vth~VDD. The input operating voltage range is not limited to this if the threshold voltage Vth of the NMOS transistors 111 and 112 is substantially zero, or the differential input stage 110_1 is configured by depletion (Vth is a negative value) NMOS transistors.

Figure 16:
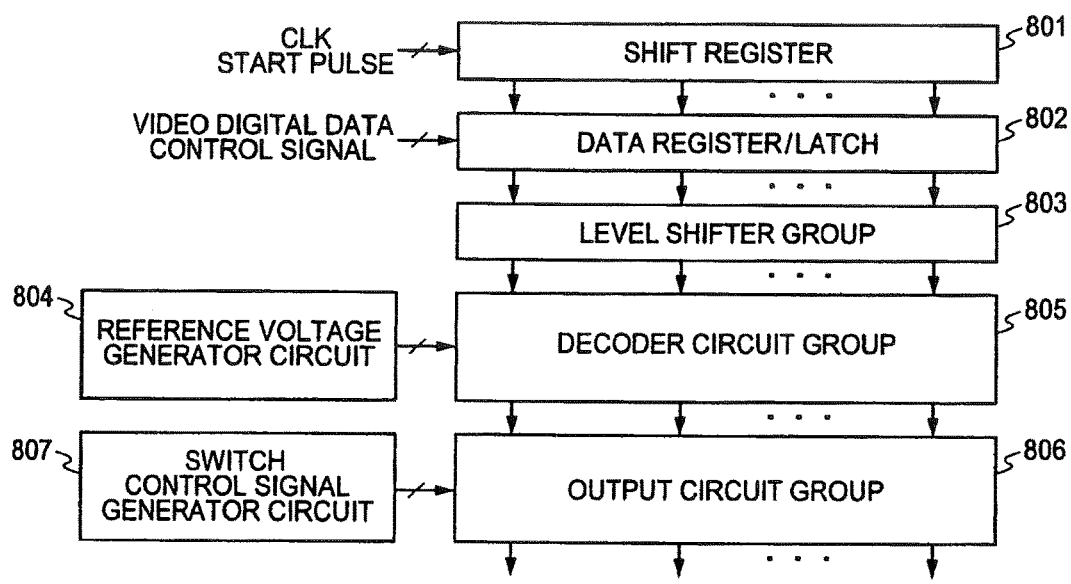
FIG. 16 is a diagram illustrating a configuration of a data driver according to a tenth embodiment of the present invention.

The output circuit 100H having the differential input stage 110_1 has the control circuit 160 as in FIG. 1, whereby in the drive of the heavy load and the high drive frequency, the output signal delay can be avoided. The differential input stage 110_1 of FIG. 16 is configured by only the Nch differential pair (112, 111) and the current source 113, but instead may be configured by only the Pch differential pair (115, 114) and the current source 116. Also, in FIGS. 3 to 8, only the differential pair of one conduction type of the Nch differential pair and the Pch differential pair may be provided.

Ninth Embodiment

Figure 15:
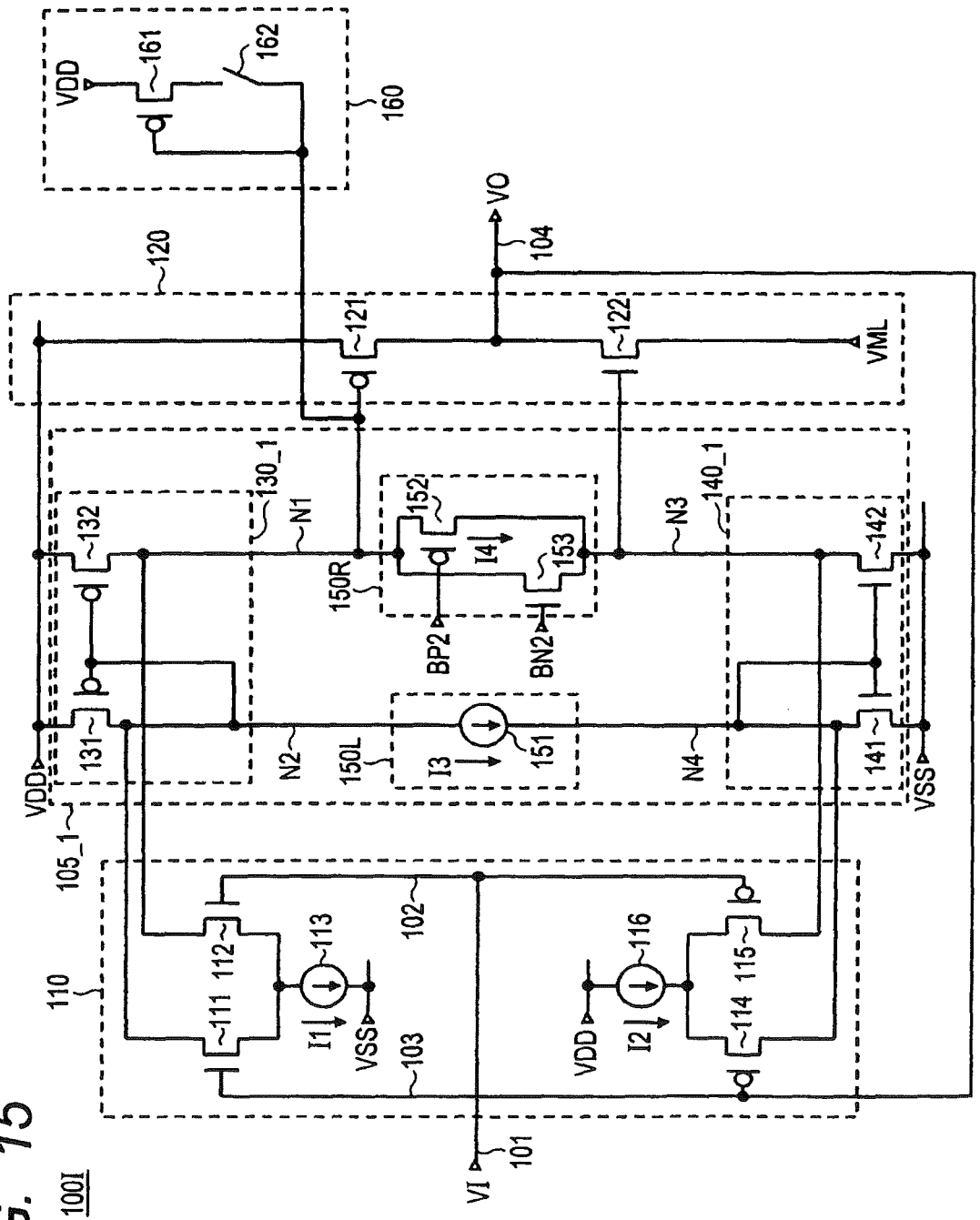
FIG. 15 is a diagram illustrating a configuration according to a ninth embodiment of the present invention.

Subsequently, a ninth embodiment of the present invention will be described. FIG. 15 is a diagram illustrating a configuration according to a ninth embodiment of the present invention. Referring to FIG. 15, in an output circuit 100I of this embodiment, the first and second current mirrors 130 and 140 of the low voltage cascade current mirror configuration in the output circuit 100A of FIG. 1 are replaced with current mirrors 130_1 and 140_1 of one stage configuration, respectively. The current mirror 130_1 includes the PMOS transistors 131 and 132 having sources coupled to the VDD supply terminal, and gates commonly coupled to each other to form the input node (N2) of the current mirror 130_1, and the drain of the PMOS transistor 132 forms the output node (N1) of the current mirror 130_1. The current mirror 140_1 includes NMOS transistors 141 and 142 having sources coupled to the VSS supply terminal and gates commonly coupled to each other. The drain and gate of the NMOS transistor 141 are commonly coupled to each other to form the input node (The input node N4) of the current mirror 140_1, and the drain of the NMOS transistor 142 forms the output node (N3) of the current mirror 140_1. The drains of the NMOS transistors 111 and 112 forming the outputs of the Nch differential pair are coupled to the respective nodes N2 and N1. The drains of the PMOS transistors 114 and 115 forming the outputs of the Pch differential pair are coupled to the respective nodes N4 and N3. As in FIG. 1, the output circuit 100I includes the control circuit 160 whereby the output signal delay can be avoided in the drive of the heavy load and the high drive frequency. Similarly, in FIGS. 3 to 8, the first and second current mirrors 130 and 140 of the low-voltage cascade current mirror configuration may be replaced with the current mirrors 130_1 and 140_1 each having a one-stage configuration.

Tenth Embodiment

Subsequently, a tenth embodiment of the present invention will be described. FIG. 16 is a diagram illustrating a main configuration of a data driver in a display device according to the tenth embodiment of the present invention. The data driver corresponds to, for example, the data driver 980 in FIG. 17A. Referring to FIG. 16, the data driver includes a shift register 801, a data register/latch 802, a level shifter group 803, a reference voltage generator circuit 804, a decoder circuit group 805, an output circuit group 806, and a switch control signal generator circuit 807.

The respective output circuits of the output circuit group 806 can be configured by the output circuits 100A to 100I in the respective embodiments described with reference to FIGS. 1, 3 to 8, 14, and 15. A plurality of the output circuits are provided in correspondence with the number of outputs. The switch control signal generator circuit 807 generates a signal for controlling the on/off operation of the switch 162, 172, 164, 174, the switches SW31, SW33, SW41, SW43, SW51, SW53, SW57, SW55, SW61, SW63, and the switches SW32, SW34, SW42, SW44, SW52, SW54, SW56, SW58, SW62, SW64.

The shift register 801 determines timing of data latch on the basis of a start pulse and a clock signal CLK. The data register/latch 802 develops input video digital data into a digital data signal of each output unit on the basis of the timing determined by the shift register 801, latches data every given output number, and outputs the data to the level shifter circuit group 803 according to the control signal. The level shifter group 803 converts the digital data signal of each output unit output from the data register/latch 802 from a low-amplitude signal to a high-amplitude signal in level, and outputs the signal to the decoder circuit group 805. The decoder circuit group 805 selects one or plural reference voltages corresponding to the input digital data signal from a reference voltage group generated by the reference voltage generator circuit 804 for each output. The output circuit group 806 receives the one or plural reference voltages selected by the corresponding decoder of the decoder circuit group 805, and amplifies and outputs a gradation signal corresponding to the input reference voltage. The output terminal group of the output circuit group 806 is coupled to the data lines of the display device. The shift register 801 and the data register/latch 802 are each configured by a logic circuit, generally have a low voltage (for example, 0V to 3.3V), and are applied with a corresponding supply voltage. The level shifter group 803, the decoder circuit group 805, and the output circuit group 806 each have a high voltage (for example, 0V to 18V) necessary to drive a display element, and are each applied with a corresponding supply voltage. A polarity inverting signal is further input to the data driver that drives the liquid crystal display device, and the output circuit group 806 outputs a positive or negative gradation voltage signal according to the polarity inverting signal. Also, no polarity inverting signal is required for the data driver that drives the organic light emitting diode display device, and the gradation voltage signal is output from the output circuit group 806.

The output circuits 100A to 100I of the respective embodiments described with reference to FIGS. 1, 3 to 8, 14, and 15 each suppress the output delay after switching the output period in the drive of the data line coupled to the output terminal of the output circuit, and are preferably configured as the respective output circuits of the output circuit group 806 of the data driver in the display device. That is, according to this embodiment, there can be realized the data driver that enables high speed drive without any output delay, and the display device with a high quality excellent in display characteristic.

The respective disclosures of the above-described patent documents are incorporated into the present specification with quotation. The embodiments and examples can be changed or modified on the basis of the basic technological thought within the entire disclosure (including claims) of the present invention. Also, various combinations or selections of various disclosed elements are enabled within the claims of the present invention. That is, the present invention includes various modifications and corrections that could be done by ordinary skilled persons according to the entire disclosure including the claims and the technological thought.

What is claimed:

1. A display device, comprising:
    an output circuit including:
        a differential amplifier circuit;
        an output amplifier circuit that includes a first transistor of the first conduction type coupled between the first supply terminal and the output terminal, and including a control terminal coupled to the differential amplifier circuit;
        a first control circuit;
        an input terminal;
        an output terminal; and
        first to third supply terminals to which first to third supply voltages are applied,
    wherein the third supply voltage is set to a voltage between the first supply voltage and the second supply voltage, or the second supply voltage, and
    wherein the first control circuit includes a third transistor and a first switch which are coupled in series between the first supply terminal and the control terminal of the first transistor,
    wherein the third transistor comprises:
        a source electrode coupled to the first supply terminal;
        a drain electrode coupled to one end of the first switch; and
        a gate electrode coupled to another end of the first switch and the control terminal,
    wherein in a given period in which the first switch is kept on,
    the control terminal of the first transistor is electrically conductive to the first supply terminal through the third transistor including a control terminal and a first terminal coupled thereto in a diode coupling mode, and a gate voltage of the first transistor is set to a value that the output amplifier circuit is in an output stable state.

2. The display device according to claim 1, wherein the differential amplifier circuit includes a differential input stage including a differential input pair with a first input and a second input to which an input signal of the input terminal and an output signal of the output terminal are input, respectively, and first and second current mirrors including transistor pairs of first and second conduction types, respectively, which are coupled to the first and second supply terminals, respectively.

3. The display device according to claim 2,
    wherein at least one of the first and second current mirrors receives an output current of the differential input stage, and includes a first connection circuit that connects between an input of the first current mirror and an input of the second current mirror, and a second connection circuit that connects between an output of the first current mirror and an output of the second current mirror.

4. The display device according to claim 2, wherein the output amplifier circuit includes the first transistor of the first conduction type coupled between the first supply terminal and the output terminal, and including the control terminal coupled to a coupling point between an output node of the first current mirror and one end of the second connection circuit, and a second transistor of the second conduction type coupled between the output terminal and the third supply terminal, and including a control terminal coupled to the other end of the second connection circuit.

5. The display device according to claim 1, wherein the first switch is kept on for a given period since start of an output period in which the output signal corresponding to the input signal is output from the output terminal, kept off for the remaining period of the output period.

6. The display device according to claim 1, wherein in the remaining period of the output period in which the first switch is kept off, a current path of the third transistor between the first supply terminal and the control terminal of the first transistor is cut off.

7. The display device according to claim 1,
    wherein in the first control circuit, the third transistor is of a first conduction type, and
    wherein in the given period where the first switch is on, the first terminal and the control terminal of the third transistor are coupled to the control terminal of the first transistor, and a second terminal of the third transistor is coupled to the first supply terminal.

8. The display device according to claim 1, wherein in the first control circuit, the third transistor of the first conduction type has a second terminal coupled to the first supply terminal, a first terminal coupled to one end of the first switch, and a control terminal coupled to the control terminal of the first transistor in the output amplifier circuit in common with the other end of the first switch.

9. A display device, comprising:
    a data driver including an output circuit, the output circuit comprising:
    an output circuit including:
    a differential amplifier circuit;
    an output amplifier circuit that includes a first transistor of the first conduction type coupled between the first supply terminal and the output terminal, and including a control terminal coupled to the differential amplifier circuit;
    a first control circuit;

an input terminal;

an output terminal; and first to third supply terminals to which first to third supply voltages are applied, wherein the third supply voltage is set to a voltage between the first supply voltage and the second supply voltage, or the second supply voltage, and wherein the first control circuit includes a third transistor and a first switch which are coupled in series between the first supply terminal and the control terminal of the first transistor;

a gate driver that drives scanning lines; and a display panel including a group of pixels arranged at cross portions of data lines driven by the data driver and the scanning lines driven by the gate driver, wherein the third transistor comprises:

a source electrode coupled to the first supply terminal;

a drain electrode coupled to one end of the first switch;

and a gate electrode coupled to another end of the first switch and the control terminal, wherein in a given period in which the first switch is kept on, the control terminal of the first transistor is electrically conductive to the first supply terminal through the third transistor including a control terminal and a first terminal coupled thereto in a diode coupling mode, and a gate voltage of the first transistor is set to a value that the output amplifier circuit is in an output stable state.

10. The display device according to claim 9, wherein the data driver comprises:

a decoder circuit group that decodes video digital data and generates corresponding reference signals; and an output circuit group that receives output signals of the decoder circuit group, and includes a plurality of the output circuits.

11. The display device according to claim 10, further comprising:

a switch signal generator circuit that generates a signal for controlling on/off operation of a switch of the control circuit in each of the output circuits in the output circuit group.

12. The display device according to claim 11, wherein the pixels each include one of a liquid crystal element and an organic EL element.

13. The display device according to claim 9, wherein the differential amplifier circuit includes a differential input stage including a differential input pair with a first input and a second input to which an input signal of the input terminal and an output signal of the output terminal are input, respectively, and first and second current mirrors including transistor pairs of first and second conduction types, respectively, which are coupled to the first and second supply terminals, respectively.

14. The display device according to claim 13, wherein at least one of the first and second current mirrors receives an output current of the differential input stage, and includes a first connection circuit that connects between an input of the first current mirror and an input of the second current mirror, and a second connection circuit that connects between an output of the first current mirror and an output of the second current mirror.

15. The display device according to claim 13, wherein the output amplifier circuit includes the first transistor of the first conduction type coupled between the first supply terminal and the output terminal, and including the control terminal coupled to a coupling point between an output node of the first current mirror and one end of the second connection circuit, and a second transistor of the second conduction type coupled between the output terminal and the third supply terminal, and including a control terminal coupled to the other end of the second connection circuit.

16. The display device according to claim 9, wherein the first switch is kept on for a given period since start of an output period in which the output signal corresponding to the input signal is output from the output terminal, kept off for the remaining period of the output period.

17. A display device, comprising:

an output circuit including:

a differential amplifier circuit;

an output amplifier circuit that includes a first transistor of the first conduction type coupled between the first supply terminal and the output terminal, and including a control terminal coupled to the differential amplifier circuit;

a first control circuit; and first to third supply terminals to which first to third supply voltages are applied, wherein the third supply voltage is set to a voltage between the first supply voltage and the second supply voltage, or the second supply voltage, and wherein the first control circuit includes a third transistor and a first switch which are coupled in series between the first supply terminal and the control terminal of the first transistor; and a display panel driven by the output circuit wherein the third transistor comprises:

a source electrode coupled to the first supply terminal;

a drain electrode coupled to one end of the first switch;

and a gate electrode coupled to another end of the first switch and the control terminal, wherein in a given period in which the first switch is kept on, the control terminal of the first transistor is electrically conductive to the first supply terminal through the third transistor including a control terminal and a first terminal coupled thereto in a diode coupling mode, and a gate voltage of the first transistor is set to a value that the output amplifier circuit is in an output stable state.

18. The display device according to claim 17, wherein the first switch is kept on for a given period since start of an output period in which the output signal corresponding to the input signal is output from an output terminal, kept off for the remaining period of the output period.

* * * * *